(12) United States Patent
Tsukimura et al.

(10) Patent No.: US 8,847,296 B2
(45) Date of Patent: Sep. 30, 2014

(54) SOLID-STATE IMAGING DEVICE, IMAGING APPARATUS, SUBSTRATE, SEMICONDUCTOR DEVICE AND METHOD OF MANUFACTURING THE SOLID-STATE IMAGING DEVICE

(71) Applicant: Olympus Corporation, Tokyo (JP)

(72) Inventors: Mitsuhiro Tsukimura, Tokyo (JP); Naohiro Takazawa, Tokyo (JP); Yoshiaki Takemoto, Tokyo (JP); Hiroshi Kikuchi, Tokyo (JP); Haruhisa Saito, Tokyo (JP); Yoshitaka Tadaki, Tokyo (JP); Yuichi Gomi, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/742,952

(22) Filed: Jan. 16, 2013

(65) Prior Publication Data

US 2013/0181316 A1   Jul. 18, 2013

(30) Foreign Application Priority Data

Jan. 17, 2012 (JP) ................................. 2012-006986
Mar. 30, 2012 (JP) ................................. 2012-079215
Mar. 30, 2012 (JP) ................................. 2012-081930

(51) Int. Cl.
*H01L 31/062* (2012.01)

(52) U.S. Cl.
USPC ........... 257/292; 257/291; 257/293; 257/432; 257/443; 257/444

(58) Field of Classification Search
USPC ................. 257/291, 292, 293, 432, 443, 444; 438/67
See application file for complete search history.

(56) References Cited

FOREIGN PATENT DOCUMENTS

| | | |
|---|---|---|
| JP | 2006-49361 A | 2/2006 |
| JP | 2007-281393 A | 10/2007 |
| JP | 2010-219339 A | 9/2010 |

*Primary Examiner* — Tan N Tran
(74) *Attorney, Agent, or Firm* — Westerman, Hattori, Daniels & Adrian, LLP

(57) ABSTRACT

A solid-state imaging device is a solid-state imaging device in which a first substrate formed on a first semiconductor wafer and a second substrate formed on a second semiconductor wafer are bonded via connect that electrically connects the substrates, wherein the first substrate includes photoelectric conversion units, the second substrate includes an output circuit that acquires a signal generated by the photoelectric conversion unit via the connector and outputs the signal, and dummy connectors that support the first and second bonded substrates are further arranged in a substrate region in which the connectors are not arranged in a substrate region of at least one of the first substrate and the second substrate.

31 Claims, 23 Drawing Sheets

| P11 | P12 | P13 | P14 | P15 | P16 | P17 | P18 |
| --- | --- | --- | --- | --- | --- | --- | --- |
| P21 | P22 | P23 | P24 | P25 | P26 | P27 | P28 |
| P31 | P32 | P33 | P34 | P35 | P36 | P37 | P38 |
| P41 | P42 | P43 | P44 | P45 | P46 | P47 | P48 |
| P51 | P52 | P53 | P54 | P55 | P56 | P57 | P58 |
| P61 | P62 | P63 | P64 | P65 | P66 | P67 | P68 |
| P71 | P72 | P73 | P74 | P75 | P76 | P77 | P78 |
| P81 | P82 | P83 | P84 | P85 | P86 | P87 | P88 |

: GROUP UNIT

| P11 | P12 | P13 | P14 | P15 | P16 | P17 | P18 |
| --- | --- | --- | --- | --- | --- | --- | --- |
| P21 | P22 | P23 | P24 | P25 | P26 | P27 | P28 |
| P31 | P32 | P33 | P34 | P35 | P36 | P37 | P38 |
| P41 | P42 | P43 | P44 | P45 | P46 | P47 | P48 |
| P51 | P52 | P53 | P54 | P55 | P56 | P57 | P58 |
| P61 | P62 | P63 | P64 | P65 | P66 | P67 | P68 |
| P71 | P72 | P73 | P74 | P75 | P76 | P77 | P78 |
| P81 | P82 | P83 | P84 | P85 | P86 | P87 | P88 |

: GROUP UNIT

SOLID-STATE IMAGING DEVICE, IMAGING APPARATUS, SUBSTRATE, SEMICONDUCTOR DEVICE AND METHOD OF MANUFACTURING THE SOLID-STATE IMAGING DEVICE

BACKGROUND OF THE INVENTION

1. Field of the Invention

The present invention relates to a solid-state imaging device, an imaging apparatus, and a method for manufacturing the solid-state imaging device. Further, the present invention relates to a substrate and, more specifically, a substrate having a number of electrodes formed to protrude on a base, and a semiconductor device using the substrate.

Priority is claimed on Japanese Patent Application No. 2012-006986, filed on Jan. 17, 2012, Japanese Patent Application No. 2012-079215, filed on Mar. 30, 2012, and Japanese Patent Application No. 2012-081930, filed on Mar. 30, 2012, the content of which is incorporated herein by references.

2. Description of Related Art

In recent years, video cameras, electronic still cameras, and the like have been widely popularized. A CCD (Charge Coupled Device)-type or amplification-type solid-state imaging device is used for such a camera. The amplification-type solid-state imaging device guides signal charges generated and accumulated by a photoelectric conversion unit of a pixel on which light is incident to an amplification unit provided in the pixel, and outputs the signal amplified by the amplification unit from the pixel. In the amplification-type solid-state imaging device, a plurality of pixels are arranged in a two-dimensional matrix. An example of the amplification-type solid-state imaging device includes a CMOS (Complementary Metal Oxide Semiconductor)-type solid-state imaging device using CMOS transistors.

In related art, a general CMOS-type solid-state imaging device adopts a scheme of sequentially reading, for each row, signal charges generated by photoelectric conversion units of the respective pixels arranged in a two-dimensional matrix. In this scheme, since a timing of exposure in the photoelectric conversion unit of each pixel is determined by start and end of readout of signal charges, the exposure timing differs for each row.

Further, uses of a CMOS-type solid-state imaging device having a global shutter function are increasing. In the CMOS-type solid-state imaging device having the global shutter function, signal charges generated by photoelectric conversion units are normally accumulated until readout is performed. For this reason, it is necessary to have accumulation capacitors having a light shielding property. In such a CMOS solid-state imaging device of the related art, all pixels are simultaneously exposed, and then signal charges generated by respective photoelectric conversion units are simultaneously transferred to the respective accumulation capacitors in all the pixels and temporarily accumulated. The signal charges are sequentially converted into pixel signals and read at a predetermined readout timing.

A solid-state imaging device in which a MOS image sensor chip in which micropads are formed on the side of a wiring layer in each unit cell and a signal processing chip in which micropads are formed on the side of the wiring layer in positions corresponding to the micropads of the MOS image sensor chip are connected by microbumps is disclosed in Japanese Patent Laid-Open Publication No. 2006-49361. Further, a method of preventing an increase in a chip area using a solid-state imaging device in which a first substrate having photoelectric conversion units formed therein and a second substrate having a plurality of MOS transistors formed therein are bonded is disclosed in Japanese Patent Laid-Open Publication No. 2010-219339.

A semiconductor device having a three-dimensional structure has attracted attention as a powerful structure to avoid various barriers faced by a semiconductor device having a two-dimensional structure, such as limits of lithography technology in miniaturization, an increase in wiring resistance or parasitic effects due to miniaturized wirings and an increased wiring length, a saturation tendency of an operating speed associated with the increase, or a high electric field effect due to miniaturized element dimensions, and to maintain an improved degree of integration, by three-dimensionally integrating a semiconductor element with a structure in which a number of semiconductor active layers are stacked.

For manufacture of the semiconductor device having a three-dimensional structure, a stacked semiconductor device formed by bonding wafers having a number of very small electrodes formed therein has been studied.

In such a stacked semiconductor device, formation of protrusion electrodes of a conductive material and dummy protrusion units having a greater height than the protrusion electrodes (hereinafter referred to as "dummy electrodes") on wafers and definition of a gap between the wafers using the projection units is disclosed in Japanese Patent Laid-Open Publication No. 2007-281393. Accordingly, a predetermined gap is accurately held by an electrical insulating material attached to a surface of an electronic part in an inner region of the protrusion unit.

SUMMARY OF THE INVENTION

According to a first aspect of the present invention, a solid-state imaging device is a solid-state imaging device in which a first substrate formed on a first semiconductor wafer and a second substrate formed on a second semiconductor wafer are bonded via connector that electrically connects the substrates. The first substrate includes photoelectric conversion units. The second substrate includes an output circuit that acquires a signal generated by the photoelectric conversion unit via the connector and outputs the signal. Dummy connectors that support the first and second substrates that are bonded with each other are further arranged in a substrate region in which the connector is not arranged, in a substrate region of at least one of the first substrate and the second substrate.

According to a second aspect of the present invention, in the solid-state imaging device according to the first aspect, an arrangement interval of the dummy connectors may be the same as an arrangement interval of the connector.

According to a third aspect of the present invention, in the solid-state imaging device according to the second aspect, an arrangement of at least one of the dummy connectors may be omitted.

According to a fourth aspect of the present invention, in the solid-state imaging device according to the third aspect, the arrangement of the dummy connector may be omitted to reduce pressure to be applied to the first semiconductor wafer and the second semiconductor wafer at the time of the bonding.

According to a fifth aspect of the present invention, in the solid-state imaging device according to the second aspect, an arrangement position of at least one of the dummy connectors may be shifted from arrangement positions at equal intervals.

According to a sixth aspect of the present invention, in the solid-state imaging device according to the fifth aspect, when dicing is performed after the first semiconductor wafer and the second semiconductor wafer are bonded, arrangement positions of the dummy connectors may be shifted from arrangement positions at equal intervals so that the first semiconductor wafer and the second semiconductor wafer are not separated.

According to a seventh aspect of the present invention, the solid-state imaging device according to the second aspect may include a plurality of photoelectric conversion elements as the photoelectric conversion units, the photoelectric conversion elements may be classified into one of one or more groups, and a plurality of photoelectric conversion elements classified into the same group may share one connector.

According to an eighth aspect of the present invention, in the solid-state imaging device according to the first aspect, the arrangement interval of the dummy connectors may be the same as an arrangement interval of the photoelectric conversion units.

According to a ninth aspect of the present invention, in the solid-state imaging device according to the eighth aspect, an arrangement of at least one of the dummy connectors may be omitted.

According to a tenth aspect of the present invention, in the solid-state imaging device according to the eighth aspect, an arrangement position of at least one of the dummy connectors may be shifted from arrangement positions at equal intervals.

According to an eleventh aspect of the present invention, in the solid-state imaging device according to the first aspect, the dummy connectors may be arranged to prevent distortion, cracks, and chipping of the first substrate and the second substrate.

According to a twelfth aspect of the present invention, in the solid-state imaging device according to the first aspect, an arrangement interval of at least some of the dummy connectors may be greater than the arrangement interval of the photoelectric conversion units.

According to a thirteenth aspect of the present invention, in the solid-state imaging device according to the first aspect, the arrangement interval of at least some of the dummy connectors may be greater than the arrangement interval of the connectors.

According to a fourteenth aspect of the present invention, in the solid-state imaging device according to any one of the first to thirteenth aspects, a plurality of unit circuits may be arranged in a peripheral circuit region different from a region in which the photoelectric conversion units are arranged, and an arrangement position of the dummy connector arranged on a circuit element constituting the unit circuit may be common to the plurality of unit circuits.

According to a fifteenth aspect of the present invention, in the solid-state imaging device according to any one of the first to thirteenth aspects, a plurality of unit circuits may be arranged in a peripheral circuit region different from a region in which the photoelectric conversion units are arranged, and the dummy connector may be arranged to suppress variations in circuit characteristics of the plurality of unit circuits.

According to a sixteenth aspect of the present invention, in the solid-state imaging device according to the first aspect, the first substrate may include a peripheral circuit, and the dummy connection portions may be arranged in a region outside the peripheral circuit included in the first substrate.

According to a seventeenth aspect of the present invention, in the solid-state imaging device according to the first aspect, the second substrate may include a peripheral circuit, and the dummy connectors may be arranged in a region outside the peripheral circuit included in the second substrate.

According to a eighteenth aspect of the present invention, in the solid-state imaging device according to the first aspect, the first substrate and the second substrate may include a peripheral circuit, and the dummy connectors may be arranged in regions outside the peripheral circuit included in the first substrate and outside the peripheral circuit included in the second substrate.

According to a nineteenth aspect of the present invention, in the solid-state imaging device according to the first aspect, the second substrate may include an accumulation circuit that accumulates a signal acquired via the connector, and the output circuit may output the signal accumulated in the accumulation circuit.

According to a twentieth aspect of the present invention, a solid-state imaging device is a solid-state imaging device in which a first substrate formed on a first semiconductor wafer and a second substrate formed on a second semiconductor wafer are bonded via connector that electrically connects the substrates. The first substrate includes photoelectric conversion units. The second substrate includes an output circuit that acquires a signal generated by the photoelectric conversion unit via the connector and outputs the signal. Dummy connectors that do not electrically connect the first substrate with the second substrate are further arranged in a region in which the connectors are not arranged, in a substrate region of at least one of the first substrate and the second substrate.

According to a twenty-first aspect of the present invention, an imaging apparatus is an imaging apparatus in which a first substrate formed on a first semiconductor wafer and a second substrate formed on a second semiconductor wafer are bonded via connectors that electrically connect the substrates. The first substrate includes photoelectric conversion units. The second substrate includes an output circuit that acquires a signal generated by the photoelectric conversion unit via the connector, and outputs the signal. Dummy connectors that support the first and second substrates that are bonded with each other are further arranged in a substrate region in which the connectors are not arranged, in a substrate region of at least one of the first substrate and the second substrate.

According to a twenty-second aspect of the present invention, a method of manufacturing a solid-state imaging device is a method of manufacturing a solid-state imaging device in which a first substrate formed on a first semiconductor wafer and a second substrate formed on a second semiconductor wafer are bonded via connector that electrically connects the substrates. The method includes further arranging dummy connectors that support the first and second substrates are bonded, in a substrate region in which the connectors are not arranged in a substrate region of at least one of the first substrate including photoelectric conversion units and the second substrate including an output circuit that acquires a signal generated by the photoelectric conversion unit via the connector and outputs the signal.

According to a twenty-third aspect of the present invention, the solid-state imaging device according to the first or second aspect may be diced to remove at least some of the dummy connectors.

According to a twenty-fourth aspect of the present invention, in the solid-state imaging device according to the first or second aspect, a ground wiring may be provided in the first substrate, and the ground wiring may be connected to the dummy connector.

According to a twenty-fifth aspect of the present invention, in the solid-state imaging device according to the first or second aspect, a ground wiring may be provided in the second substrate, and the ground wiring may be connected to the dummy connector.

According to a twenty-sixth aspect of the present invention, in the solid-state imaging device according to the first or second aspect, a first ground wiring may be provided in the first substrate, a second ground wiring may be provided in the second substrate, and the first ground wiring and the second ground wiring may be connected to the dummy connector.

According to a twenty-seventh aspect of the present invention, in the solid-state imaging device according to the twenty-third aspect, heat conduction patterns insulated from the photoelectric conversion unit and connected to the dummy connectors may be provided in the first substrate, and the solid-state imaging device may be diced to remove at least some of the heat conduction patterns.

According to a twenty-eighth aspect of the present invention, in the solid-state imaging device according to the twenty-third aspect, heat conduction patterns insulated from the output circuit and connected to the dummy connector may be provided in the second substrate, and the solid-state imaging device may be diced to remove at least some of the heat conduction patterns.

According to a twenty-ninth aspect of the present invention, in the solid-state imaging device according to the twenty-third aspect, a first wiring insulated from the photoelectric conversion unit and connected to the dummy connector may be provided in the first substrate, a second wiring insulated from the output circuit and connected to the dummy connector may be provided in the second substrate, and the solid-state imaging device may be diced to remove at least some of the heat conduction patterns.

According to a thirtieth aspect of the present invention, the method of manufacturing a solid-state imaging device according to the twenty-second aspect may include a removal process of performing dicing to remove at least some of the dummy connectors after the connector arranging process.

According to a thirty-first aspect of the present invention, in the method of manufacturing a solid-state imaging device according to the twenty-second aspect, a ground wiring may be provided in the first substrate, and the dummy connection portion may be connected to the ground wiring in the connector arranging process.

According to a thirty-second aspect of the present invention, a substrate includes a base having a predetermined thickness; a wiring provided in the base; an electrode provided in one surface in a thickness direction of the base and including a plurality of circuit electrodes connected to the wiring; and a dummy region provided in the same surface as the electrode and including a plurality of dummy electrodes not connected to the wiring. In at least a portion of the dummy region, the dummy electrodes are arranged as a dummy electrode set in which a plurality of dummy electrodes are arranged at a predetermined dummy pitch and the maximum distance between the dummy electrodes is within a predetermined value.

According to a thirty-third aspect of the present invention, in the substrate according to a thirty-second aspect, a set pitch that is a pitch at which the dummy electrode sets are arranged may be set to be greater than the dummy pitch.

According to a thirty-fourth aspect of the present invention, in the substrate according to a thirty-second or thirty-third aspect, at least one of a diameter of the circuit electrode and a formation pitch may be set to be equal to or less than 20 micrometers.

According to a thirty-fifth aspect of the present invention, in the substrate according to any one of a thirty-second to thirty-fourth aspects, a height of the dummy electrode may be equal to or less than the height of the circuit electrode.

According to a thirty-sixth aspect of the present invention, in the substrate according to any one of thirty-second to thirty-fifth aspects, the set pitch may be at least 10 times the dummy pitch.

According to a thirty-seventh aspect of the present invention, in the substrate according to any one of thirty-second to thirty-fifth aspects, the set pitch may be at least 3 times the maximum distance between the dummy electrodes.

According to a thirty-eighth aspect of the present invention, a semiconductor device is a semiconductor device formed by bonding at least two substrates having an electrode formed therein, wherein at least one of the substrates is a substrate according to any one of thirty-second to thirty-seventh aspects.

DETAILED DESCRIPTION OF THE INVENTION (First Embodiment)

Hereinafter, a first embodiment of the present invention will be described with reference to the drawings. The following description includes specific detailed contents as an example. However, those skilled in the art should, of course, understand that, even when the detailed contents are varied or modified, the variations and modifications are within the scope of the present invention. Accordingly, various embodiments to be described below will be described without loss of generality of the present invention described in the claims and without limitation on the present invention.

Figure 1:
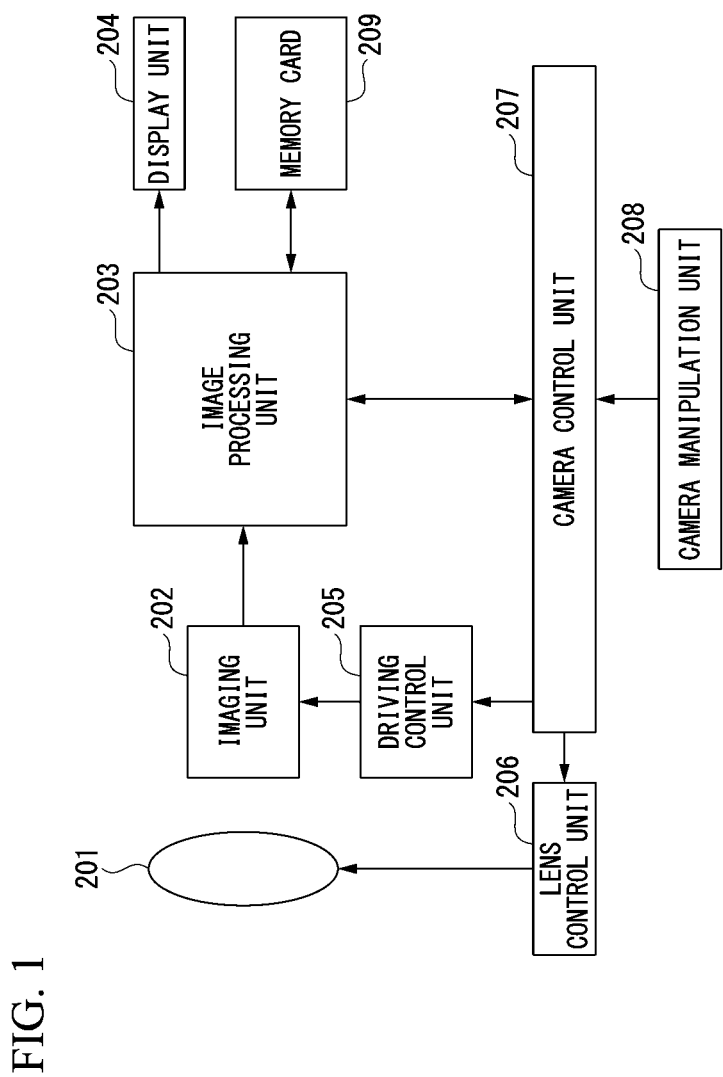
FIG. 1 is a block diagram illustrating a configuration of an imaging apparatus according to a first embodiment of the present invention.

FIG. 1 illustrates a configuration of an imaging apparatus according to the present embodiment. The imaging apparatus according to one aspect of the present invention may be an electronic device having an imaging function or may be a digital video camera, an endoscope or the like, as well as a digital still camera.

The imaging apparatus illustrated in FIG. 1 includes a lens 201, an imaging unit 202, an image processing unit 203, a display unit 204, a driving control unit 205, a lens control unit 206, a camera control unit 207, and a camera manipulation unit 208. While a memory card 209 is also illustrated in FIG. 1, the memory card 209 may not be a component unique to the imaging device by causing the memory card 209 to be detachable with respect to the imaging device.

While respective blocks illustrated in FIG. 1 may be realized by various parts, such as electrical circuit parts such as a CPU, a memory and the like of a computer, an optical part such as a lens, and a manipulation part such as a button or a switch from a point of view of hardware, and may be realized by a computer program or the like from a point of view of software, the blocks are drawn as functional blocks realized by cooperation of the hardware and the software. Accordingly, it is understood by those skilled in the art that the functional blocks may be realized in various forms by a combination of hardware and software.

The lens 201 is an imaging lens for forming an optical image of a subject on an imaging surface of the imaging unit 202 constituting a solid-state imaging device (solid-state imaging element). The imaging unit 202 includes a plurality of pixels, and converts the optical image of the subject formed by the lens 201 into a digital image signal through photoelectric conversion and outputs the digital image signal. The image processing unit 203 performs various digital image processing on the image signal output from the imaging unit 202.

The display unit 204 displays an image based on the image signal subjected to the image processing for display by the image processing unit 203. This display unit 204 can reproduce and display a still image and perform video (live view) display to display an image within an imaging range in real time. The driving control unit 205 controls an operation of the imaging unit 202 based on an instruction from the camera control unit 207. Based on an instruction from the camera control unit 207, the lens control unit 206 controls the aperture and the focal position of the lens 201.

The camera control unit 207 controls the entire imaging apparatus. An operation of the camera control unit 207 is defined by a program stored in a ROM built in the imaging apparatus. The camera control unit 207 reads this program and performs various controls according to content defined by the program. The camera manipulation unit 208 includes various manipulation members for a user to perform various manipulation inputs for the imaging apparatus, and outputs a signal based on a result of the manipulation input to the camera control unit 207. Concrete examples of the camera manipulation unit 208 may include a power switch for turning power of the imaging apparatus on and off, a release button for instructing still image photography, and a still image photography mode switch for switching a still image capturing mode between a single photography mode and a continuous photography mode. The memory card 209 is a recording medium for holding an image signal processed for recording by the image processing unit 203.

Figure 2:
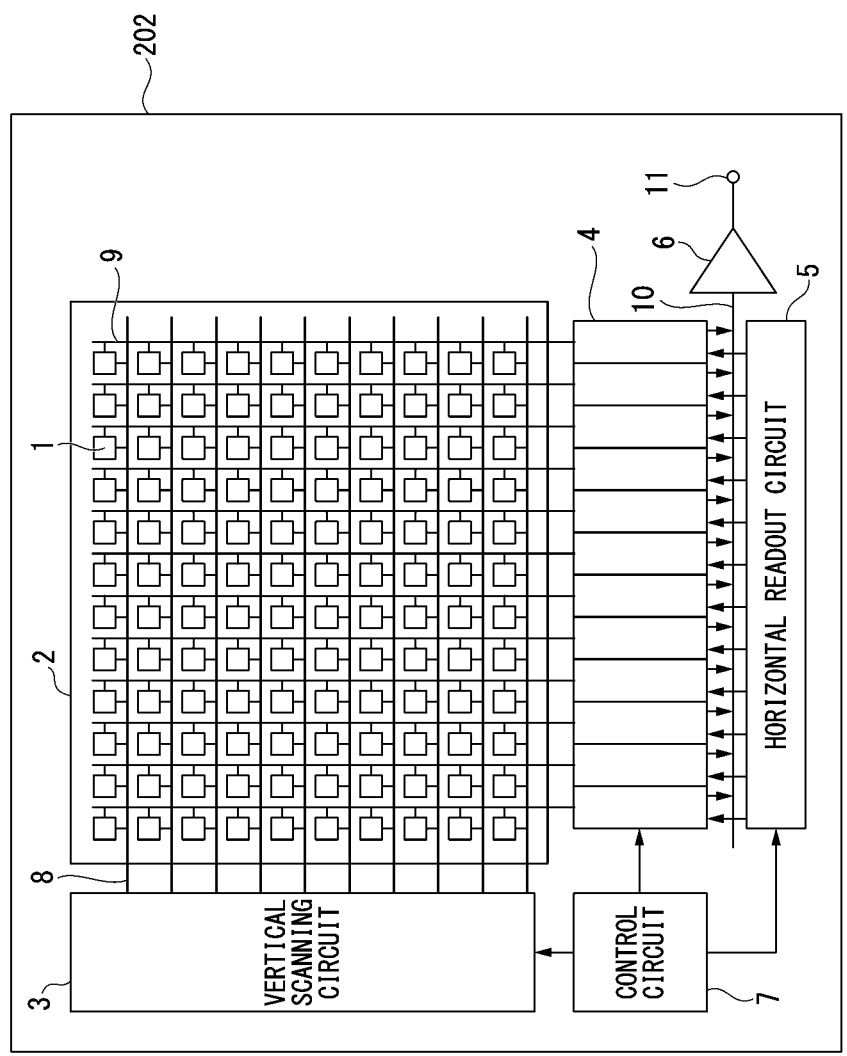
FIG. 2 is a block diagram illustrating a configuration of an imaging unit included in the imaging apparatus according to the first embodiment of the present invention.

FIG. 2 illustrates a configuration of the imaging unit 202. The imaging unit 202 includes a pixel unit 2 including a plurality of pixels 1, a vertical scanning circuit 3, a column processing circuit 4, a horizontal readout circuit 5, an output amplifier (an output circuit) 6, and a control circuit 7. Arrangement positions of the respective circuit elements illustrated in FIG. 2 do not necessarily match actual arrangement positions.

In the pixel unit 2, the plurality of pixels 1 are arranged in a two-dimensional matrix. In FIG. 2, 120 pixels 1 are arranged in 10 rows×12 columns. However, an array of the pixels illustrated in FIG. 2 is an example, and the numbers of rows and columns may be 2 or more. Further, FIG. 2 is a diagram schematically illustrating a state in which the respective pixels 1 are arranged in a matrix shape. The respective pixels are not arranged separately as illustrated in FIG. 2. As will be described below, some circuit elements are shared among the plurality of pixels in practice.

In the present embodiment, while a region including all the pixels, included in the imaging unit 202, is a pixel signal readout target region, a portion of the region including all the pixels, included in the imaging unit 202, may be a readout target region. It is desirable for the readout target region to include at least all pixels in an effective pixel region. Further, the readout target region may include optical black pixels (constantly light-shielded pixels) arranged outside the effective pixel region. A pixel signal read from the optical black pixel is used, for example, for correction of a dark current component.

The vertical scanning circuit 3 includes, for example, a shift register and performs driving control of the pixels 1 in units of rows. This driving control includes a reset operation, an accumulation operation, and a signal readout operation of the pixels 1. In order to perform this driving control, the vertical scanning circuit 3 outputs a control signal (a control pulse) to each pixel 1 via a control signal line 8 provided in each row and independently controls the pixel 1 for each row. As the vertical scanning circuit 3 performs the driving control, a pixel signal is output from the pixel 1 to a vertical signal line 9 provided in each column.

The column processing circuit 4 is connected to the vertical signal line 9 of each column, and performs signal processing such as noise removal and amplification on the pixel signal output from the pixel 1. The horizontal readout circuit 5 includes, for example, a shift register. The horizontal readout circuit 5 selects a pixel column to read pixel signals, and sequentially selects the column processing circuit 4 according to the selected pixel column. Further, the horizontal readout circuit 5 reads the pixel signals by sequentially outputting the pixel signals from the column processing circuit 4 to the horizontal signal line 10. The output amplifier 6 performs signal processing on the pixel signal output to the horizontal signal line 10. The output amplifier 6 outputs the pixel signal to the outside via an output terminal 11. The control circuit 7 generates a clock signal serving as a reference for an operation of the vertical scanning circuit 3, the column processing circuit 4, the horizontal readout circuit 5 and the like, a control signal or the like, and outputs the signal to the vertical scanning circuit 3, the column processing circuit 4, the horizontal readout circuit 5, and the like.

Figure 3:
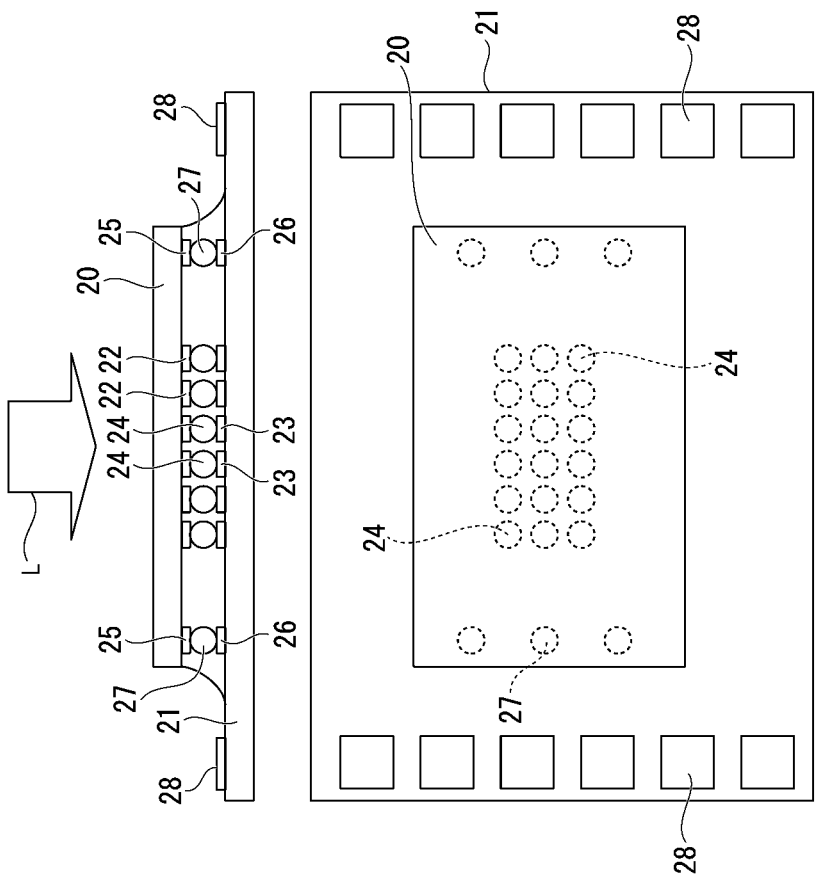
FIG. 3A is a cross-sectional view of the imaging unit included in the imaging apparatus according to the first embodiment of the present invention.
FIG. 3B is a plan view of the imaging unit included in the imaging apparatus according to the first embodiment of the present invention.

FIGS. 3A and 3B illustrate a cross-sectional structure (FIG. 3A) and a planar structure (FIG. 3B) of the imaging unit 202. In an example illustrated in FIGS. 3A and 3B, a dummy connection unit is not described. The dummy connection will be described below. The imaging unit 202 has a structure in which two substrates (a first substrate 20 and a second substrate 21) having circuit elements (photoelectric conversion elements (photoelectric conversion units), transistors, capacitors, etc.) constituting the pixels 1 arranged therein overlap. The circuit elements constituting the pixels 1 are distributed and arranged in the first substrate 20 (the first substrate) and the second substrate 21 (the second substrate). The first substrate 20 and the second substrate 21 are electrically connected so that electrical signals can be transferred between the two substrates at the time of driving the pixels 1. For example, the photoelectric conversion elements are arranged in the first substrate 20, and the output amplifier 6 that outputs a signal output from the photoelectric conversion element to the outside is arranged in the second substrate 21.

Among two main surfaces of the first substrate 20 (surfaces whose surface area is relatively greater than a side), the photoelectric conversion elements are formed in the main surface irradiated with light L and the light radiated to the first substrate 20 is incident on the photoelectric conversion elements. A number of micropads 22, which are electrodes for connection with the second substrate 21, are formed in the main surface opposite to the main surface irradiated with the light L among the two main surfaces of the first substrate 20. One micropad 22 is arranged for one pixel or for a plurality of pixels. Further, among two main surfaces of the second substrate 21, a number of micropads 23, which are electrodes for connection with the first substrate 20, are formed in positions corresponding to the micropads 22 in the main surface facing the first substrate 20.

Microbumps 24 are formed between the micropads 22 and the micropads 23. The first substrate 20 and the second substrate 21 are arranged to overlap so that the micropads 22 and micropads 23 face each other. The micropad 22 and the micropad 23 are integrally formed to be electrically connected by the microbumps 24. The micropad 22, the microbump 24, and the micropad 23 constitute a connector connecting the first substrate 20 and the second substrate 21. The micropads 22 and 23 and the microbump 24 have conductivity, and are formed of a metal such as gold or silver having high thermal conductivity. The signal based on the signal charges generated by the photoelectric conversion element arranged in the first substrate 20 is output to the second substrate 21 via the micropad 22, the microbump 24, and the micropad 23.

Micropads 25 having the same structure as the micropads 22 are formed in a peripheral portion of the main surface opposite to the main surface irradiated with the light L among the two main surfaces of the first substrate 20. Micropads 26 having the same structure as the micropads 23 are formed in positions corresponding to the micropads 25 in the main surface facing the first substrate 20 among the two main surfaces of the second substrate 21. Microbumps 27 are formed between the micropads 25 and the micropads 26. A supply voltage for driving the circuit elements arranged in the first substrate 20 or the circuit elements arranged in the second substrate 21 is supplied from the first substrate 20 to the second substrate 21 or from the second substrate 21 to the first substrate 20 via the micropads 25, the microbumps 27, and the micropads 26.

Pads 28 used as an interface with a system other than the first substrate 20 and the second substrate 21 are formed in a peripheral portion of one of the two main surfaces of the second substrate 21. Through electrodes passing through the second substrate 21 may be provided and used as electrodes for connection with the outside, in place of the pads 28. In the example illustrated in FIG. 3, while the main surfaces of the first substrate 20 and the second substrate 21 have different areas, the main surfaces of the first substrate 20 and the second substrate 21 may have the same areas. Further, the micropads provided in the surface of the first substrate 20 may be directly bonded with the micropads provided in the surface of the second substrate 21 to connect the first substrate 20 and the second substrate 21, instead of providing the microbumps.

The circuit elements constituting the pixels 1 are distributed and arranged in the first substrate 20 and the second substrate 21. The vertical scanning circuit 3, the column processing circuit 4, the horizontal readout circuit 5, the output amplifier 6 and the control circuit 7 other than the pixels 1 may be arranged in any one of the first substrate 20 and the second substrate 21. Further, the circuit elements constituting each of the vertical scanning circuit 3, the column processing circuit 4, the horizontal readout circuit 5, the output amplifier 6, and the control circuit 7 may be distributed and arranged in the first substrate 20 and the second substrate 21. Configurations other than the pixels 1 may require transfer of signals between the first substrate 20 and the second substrate 21. However, the first substrate 20 and the second substrate 21 may be connected using micropads and microbumps or the first substrate 20 and the second substrate 21 may be connected by directly connecting the micropads, as in the pixels 1.

Figure 4:
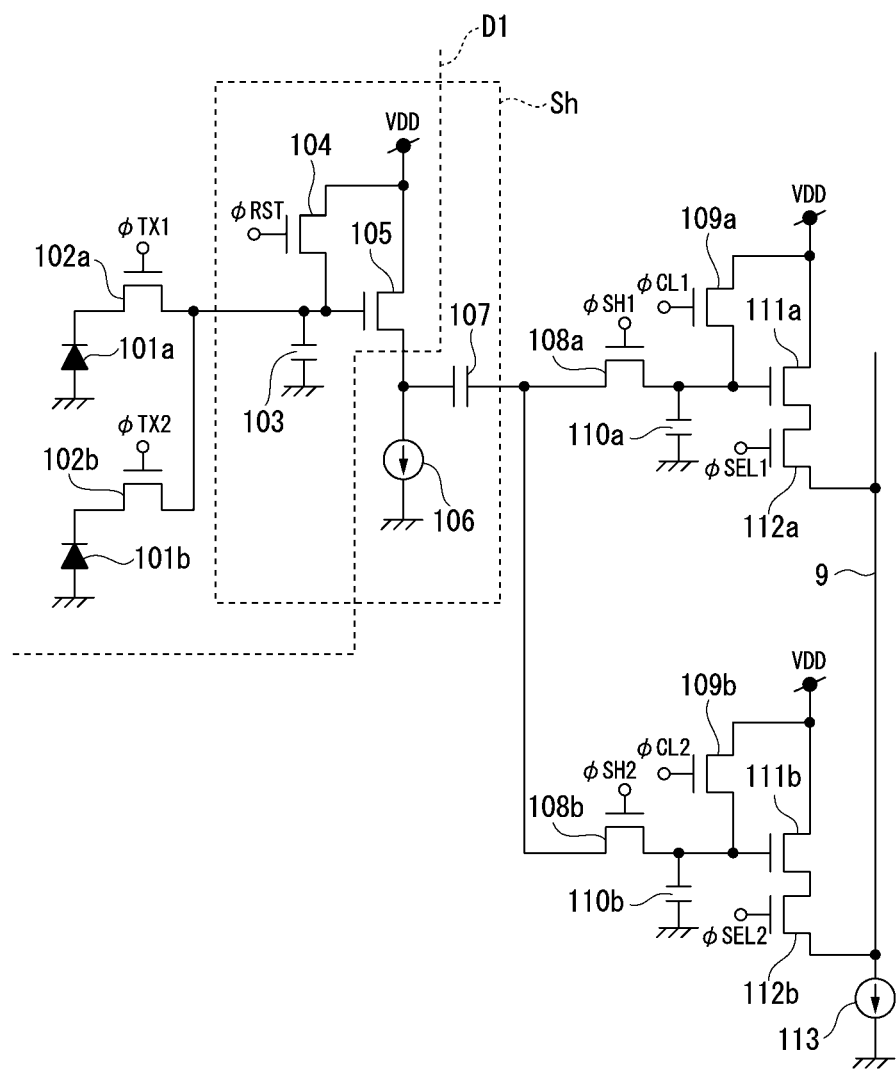
FIG. 4 is a circuit diagram illustrating a circuit configuration of a pixel included in the imaging apparatus according to the first embodiment of the present invention.

FIG. 4 illustrates a circuit configuration of the pixels 1 corresponding to two pixels. The pixels 1 (two pixels) include photoelectric conversion elements (photoelectric conversion units) 101a and 101b, transfer transistors 102a and 102b, an FD (floating diffusion) 103, an FD reset transistor 104, a first amplification transistor 105, a current source 106, a clamp capacitor 107, sample transistors 108a and 108b, analog-memory reset transistors 109a and 109b, analog memories 110a and 110b, second amplification transistors 111a and 111b, and selection transistors 112a and 112b. An arrangement position of each circuit element illustrated in FIG. 4 does not necessarily match an actual arrangement position.

In FIG. 4, the circuit elements of a first pixel and the circuit elements of a second pixel are included. The first pixel includes the photoelectric conversion element 101a, the transfer transistor 102a, the FD 103, the FD reset transistor 104, the first amplification transistor 105, the current source 106, the clamp capacitor 107, the sample transistor 108a, the analog-memory reset transistor 109a, the analog memory 110a, the second amplification transistor 111a, and the selection transistor 112a. The second pixel includes the photoelectric conversion element 101b, the transfer transistor 102b, the FD 103, the FD reset transistor 104, the first amplification transistor 105, the current source 106, the clamp capacitor 107, the sample transistor 108b, the analog-memory reset transistor 109b, the analog memory 110b, the second amplification transistor 111b, and the selection transistor 112b. The FD 103, the FD reset transistor 104, the first amplification transistor 105, the current source 106, and the clamp capacitor 107, which are arranged in a shared region Sh illustrated in FIG. 4, are shared by the first pixel and the second pixel.

One terminal of the photoelectric conversion element 101a is grounded. A drain terminal of the transfer transistor 102a is connected to the other terminal of the photoelectric conversion element 101a. A gate terminal of the transfer transistor 102a is connected to the vertical scanning circuit 3 and supplied with a transfer pulse ΦTX1.

One terminal of the photoelectric conversion element 101b is grounded. A drain terminal of the transfer transistor 102b is connected to the other terminal of the photoelectric conversion element 101b. A gate terminal of the transfer transistor 102b is connected to the vertical scanning circuit 3 and supplied with a transfer pulse ΦTX2.

One terminal of the FD 103 is connected to source terminals of the transfer transistors 102a and 102b, and the other terminal of the FD 103 is grounded. A drain terminal of the FD reset transistor 104 is connected to a supply voltage VDD. A source terminal of the FD reset transistor 104 is connected to the source terminals of the transfer transistors 102a and 102b. A gate terminal of the FD reset transistor 104 is connected to the vertical scanning circuit 3 and supplied with an FD reset pulse ΦRST.

A drain terminal of the first amplification transistor 105 is connected to the supply voltage VDD. A gate terminal that is an input unit of the first amplification transistor 105 is connected to the source terminals of the transfer transistors 102a and 102b. One terminal of the current source 106 is connected to a source terminal of the first amplification transistor 105, and the other terminal of the current source 106 is grounded. As an example, the current source 106 may include a transistor having a drain terminal connected to the source terminal of the first amplification transistor 105, a grounded source terminal, and a gate terminal connected to the vertical scanning circuit 3.

One terminal of the clamp capacitor 107 is connected to the source terminal of the first amplification transistor 105 and the one terminal of the current source 106.

A drain terminal of the sample transistor 108a is connected to the other terminal of the clamp capacitor 107. A gate terminal of the sample transistor 108a is connected to the vertical scanning circuit 3 and supplied with a sample pulse ΦSH1.

A drain terminal of the sample transistor 108b is connected to the other terminal of the clamp capacitor 107. A gate terminal of the sample transistor 108b is connected to the vertical scanning circuit 3 and supplied with a sample pulse ΦSH2.

A drain terminal of the analog-memory reset transistor 109a is connected to the supply voltage VDD. A source terminal of the analog-memory reset transistor 109a is connected to a source terminal of the sample transistor 108a. A gate terminal of the analog-memory reset transistor 109a is connected to the vertical scanning circuit 3 and supplied with a clamp and memory reset pulse ΦCL1.

A drain terminal of the analog-memory reset transistor 109b is connected to the supply voltage VDD. A source terminal of the analog-memory reset transistor 109b is connected to a source terminal of the sample transistor 108b. A gate terminal of the analog-memory reset transistor 109b is connected to the vertical scanning circuit 3 and supplied with a clamp and memory reset pulse ΦCL2.

One terminal of the analog memory 110a is connected to the source terminal of the sample transistor 108a, and the other terminal of the analog memory 110a is grounded. A drain terminal of the second amplification transistor 111a is connected to the supply voltage VDD. A gate terminal that constitutes an input unit of the second amplifier transistor 111a is connected to the source terminal of the sample transistor 108a.

A drain terminal of the selection transistor 112a is connected to a source terminal of the second amplification transistor 111a. A source terminal of the selection transistor 112a is connected to the vertical signal line 9. A gate terminal of the selection transistor 112a is connected to the vertical scanning circuit 3 and supplied with a selection pulse ΦSEL1.

One terminal of the analog memory 110b is connected to the source terminal of the sample transistor 108b, and the other terminal of the analog memory 110b is grounded. A drain terminal of the second amplification transistor 111b is connected to the supply voltage VDD. A gate terminal constituting an input unit of the second amplification transistor 111b is connected to the source terminal of the sample transistor 108b.

A drain terminal of the selection transistor 112b is connected to the source terminal of the second amplification transistor 111b. A source terminal of the selection transistor 112b is connected to the vertical signal line 9. A gate terminal of the selection transistor 112b is connected to the vertical scanning circuit 3 and supplied with a selection pulse ΦSEL2. The above-described transistors may have polarities that are reverse to the above, and the source and drain terminals may be the reverse to those.

The photoelectric conversion elements 101a and 101b are, for example, photodiodes, generate (produced) signal charges based on incident light, and hold and accumulate the generated (produced) signal charges. The transfer transistors 102a and 102b are transistors that transfer the signal charges accumulated in the photoelectric conversion elements 101a and 101b to the FD 103. On/off of the transfer transistor 102a is controlled by the transfer pulse ΦTX1 from the vertical scanning circuit 3. On/off of the transfer transistor 102b is controlled by the transfer pulse ΦTX2 from the vertical scanning circuit 3. The FD 103 is a capacitor that temporarily holds and accumulates the signal charges transferred from photoelectric conversion elements 101a and 101b.

The FD reset transistor 104 is a transistor that resets the FD 103. On/off of the FD reset transistor 104 is controlled by the FD reset pulse ΦRST from the vertical scanning circuit 3. The photoelectric conversion elements 101a and 101b may be reset by simultaneously turning the FD reset transistor 104 and the transfer transistors 102a and 102b on. The reset of the FD 103/the photoelectric conversion elements 101a and 101b controls an amount of charges accumulated in the FD 103/the photoelectric conversion elements 101a and 101b to set a state (a potential) of the FD 103/the photoelectric conversion elements 101a and 101b to a reference state (a reference potential or a reset level).

The first amplification transistor 105 is a transistor that outputs, from the source terminal, an amplified signal obtained by amplifying a signal based on the signal charges accumulated in the FD 103, which is input to the gate terminal. The current source 106 functions as a load of the first amplification transistor 105 and supplies a current to the first amplification transistor 105 to drive the first amplification transistor 105. The first amplification transistor 105 and the current source 106 constitute a source follower circuit.

The clamp capacitor 107 is a capacitor that clamps (fixes) a voltage level of the amplified signal that is output from the first amplification transistor 105. The sample transistors 108a and 108b are transistors that sample and hold the voltage level of the other terminal of the clamp capacitor 107 and accumulate the signal in the analog memories 110a and 110b. On/off of the sample transistor 108a is controlled by the sample pulse ΦSH1 from the vertical scanning circuit 3. On/off of the sample transistor 108b is controlled by the sample pulse ΦSH2 from the vertical scanning circuit 3.

The analog-memory reset transistors 109a and 109b are transistors that reset the analog memories 110a and 110b. On/off of the analog-memory reset transistors 109a and 109b is controlled by the clamp and memory reset pulses ΦCL1 and ΦCL2 from the vertical scanning circuit 3. Reset of the analog memories 110a and 110b controls an amount of charges accumulated in the analog memories 110a and 110b to set a state (potential) of the analog memories 110a and 110b to a reference state (a reference potential or a reset level). The analog memories 110a and 110b hold and accumulate analog signals sampled and held by sample transistors 108a and 108b.

Capacitances of the analog memories 110a and 110b are set to be greater than the capacitance of the FD 103. It is more desirable to use MOS (Metal Oxide Semiconductor) capacitors or MIM (Metal Insulator Metal) capacitors that are capacitors having a low leak current (dark current) per unit region, as the analog memories 110a and 110b. Accordingly, noise immunity can be improved and a high quality signal can be obtained.

The second amplification transistors 111a and 111b are transistors that output, from the sources, the amplified signal obtained by amplifying signals based on the signal charges accumulated in the analog memories 110a and 110b, which are input to the gate terminals. The second amplification transistors 111a and 111b and a current source 113 connected as a load to the vertical signal line 9 constitute a source follower circuit. The selection transistors 112a and 112b are transistors that select the pixels 1 and transfer outputs of the second amplification transistors 111a and 111b to the vertical signal line 9. On/off of the selection transistor 112a is controlled by the selection pulse ΦSEL1 from the vertical scanning circuit 3. On/off of the selection transistor 112b is controlled by the selection pulse ΦSEL2 from the vertical scanning circuit 3.

Among the circuit elements illustrated in FIG. 4, the photoelectric conversion elements 101a and 101b are arranged in the first substrate 20, the analog memories 110a and 110b are arranged in the second substrate 21, and the other circuit elements are arranged in any one of the first substrate 20 and the second substrate 21. A dotted line D1 in FIG. 4 indicates a boundary of the first substrate 20 and the second substrate 21. The photoelectric conversion elements 101a and 101b, the transfer transistors 102a and 102b, the FD 103, the FD reset transistor 104, and the first amplification transistor 105 are arranged in the first substrate 20. The current source 106, the clamp capacitor 107, the sample transistors 108a and 108b, the analog-memory reset transistors 109a and 109b, the analog memories 110a and 110b, the second amplification transistors 111a and 111b, and the selection transistors 112a and 112b are arranged in the second substrate 21.

The amplified signal output from the first amplification transistor 105 of the first substrate 20 is output to the second substrate 21 via the micropad 22, the microbump 24 and the micropad 23. Also, the supply voltage VDD is transferred between the first substrate 20 and the second substrate 21 via the micropads 25, the microbumps 27 and the micropads 26.

While the connector including the micropad 22, the microbump 24, and the micropad 23 is arranged in a path among the source terminal of the first amplification transistor 105, the one terminal of the current source 106 and the one terminal of the clamp capacitor 107 in FIG. 4, the present invention is not limited thereto. The connector may be arranged in any position on an electrically connected path from the photoelectric conversion elements 101a and 101b to the analog memories 110a and 110b.

Figure 5:
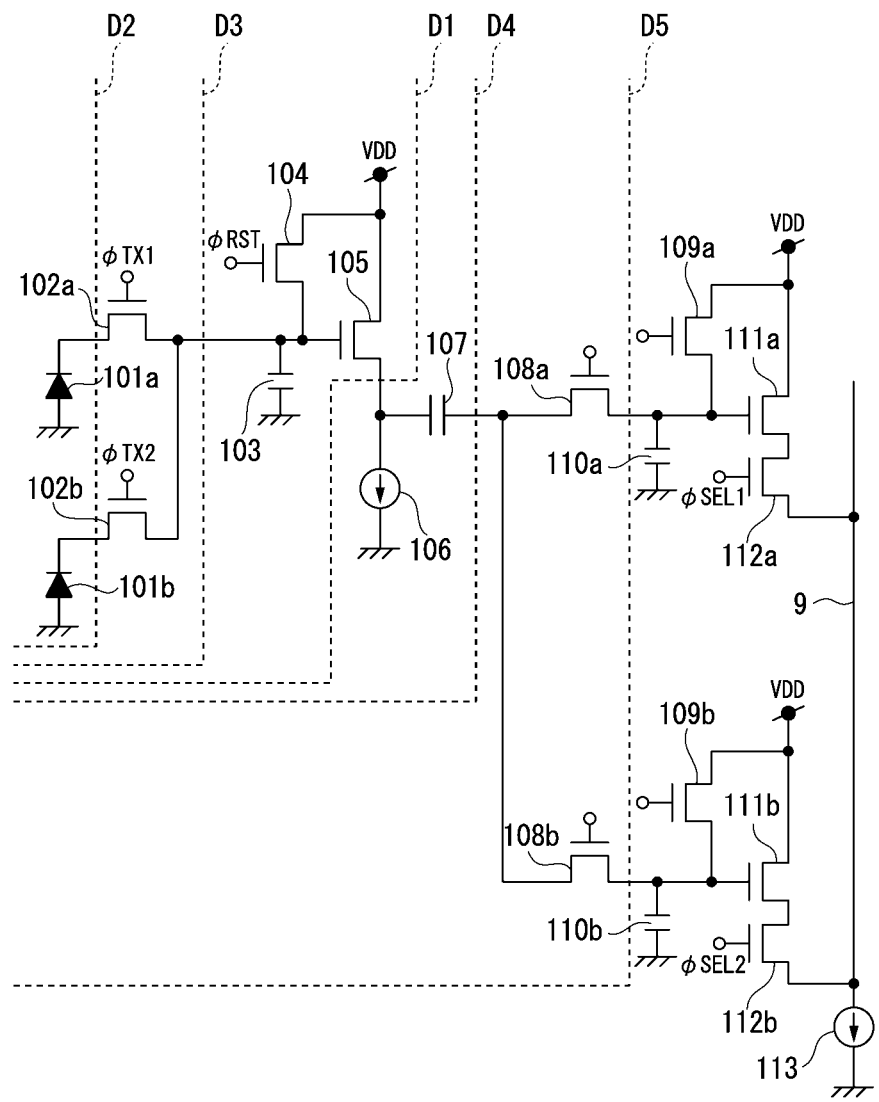
FIG. 5 is a circuit diagram illustrating a circuit configuration of a pixel included in the imaging apparatus according to the first embodiment of the present invention.

FIG. 5 illustrates an example of the boundary of the first substrate 20 and the second substrate 21. FIG. 5 illustrates an example in which dotted lines D1 to D5 can be boundaries between the first substrate 20 and the second substrate 21. The boundary of the first substrate 20 and the second substrate 21 may also be any of the dotted lines D1 to D5 or may be elsewhere. The dotted line D1 is as described above. In the example of the dotted line D2, the connector is arranged in a path between the other terminals of the photoelectric conversion elements 101a and 101b and the drain terminals of the transfer transistors 102a and 102b. In the example of the dotted line D3, the connector is arranged in a path among the source terminals of the transfer transistors 102a and 102b, the one terminal of the FD 103, the source terminal of the FD reset transistor 104, and the gate terminal of the first amplification transistor 105.

In the example of the dotted line D4, the connector is arranged in a path between the other terminal of the clamp capacitor 107 and the drain terminals of the sample transistors 108a and 108b. In the example of the dotted line D5, the connector is arranged in a path among the source terminals of the sample transistors 108a and 108b, the source terminals of the analog-memory reset transistors 109a and 109b, the one terminals of the analog memories 110a and 110b, and the gate terminals of the second amplification transistors 111a and 111b.

All the pixels 1 having the above configuration are classified into a plurality of groups, and each pixel 1 belongs to any one of the plurality of groups. FIG. 6 illustrates a state in which 64 pixels 1 in 8 rows×8 columns are classified into a plurality of groups, for example. In FIG. 6, a number Pnm (n: 1 to 8 and m: 1 to 8) is assigned to each pixel 1 for convenience. In the number Pnm, the digit n indicates a row number and the digit m indicate a column number.

Figure 6A:
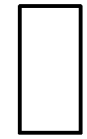
FIG. 6A is a reference diagram illustrating a state in which pixels are classified into a plurality of groups in the imaging apparatus according to the first embodiment of the present invention.
Figure 6B:
FIG. 6B is a reference diagram illustrating a state in which pixels are classified into a plurality of groups in the imaging apparatus according to the first embodiment of the present invention.

According to pixel positions, the pixels 1 are classified into a plurality of groups. FIG. 6A illustrates an example in which two pixels constitute one group. The two pixels adjacent in a vertical direction constitute one group. FIG. 6B illustrates an example in which four pixels constitute one group. The four pixels continuously arranged in the vertical direction constitute one group. Because one photoelectric conversion element corresponds to one pixel 1, a group to which the pixel 1 belongs is the same as a group to which the photoelectric conversion element belongs. A plurality of photoelectric conversion elements of the pixels 1 in the same group (two photoelectric conversion elements in the example of FIG. 6A and four photoelectric conversion elements in the example of FIG. 6B) share the FD 103, the FD reset transistor 104, the first amplification transistor 105, the current source 106, and the clamp capacitor 107.

Next, an operation of the pixels 1 will be described with reference to FIGS. 7 and 8. Hereinafter, two operation examples will be described.

<First Operation Example>

Figure 7:
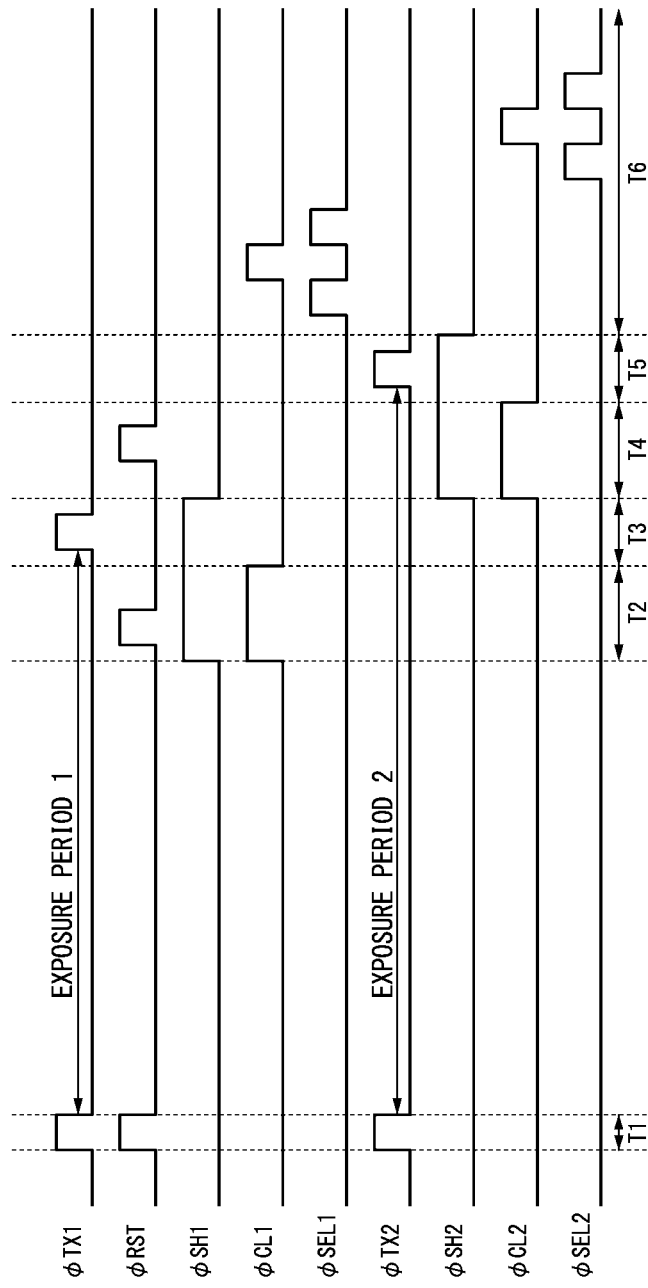
FIG. 7 is a timing chart illustrating an operation of a pixel included in the imaging apparatus according to the first embodiment of the present invention.
Figure 8:
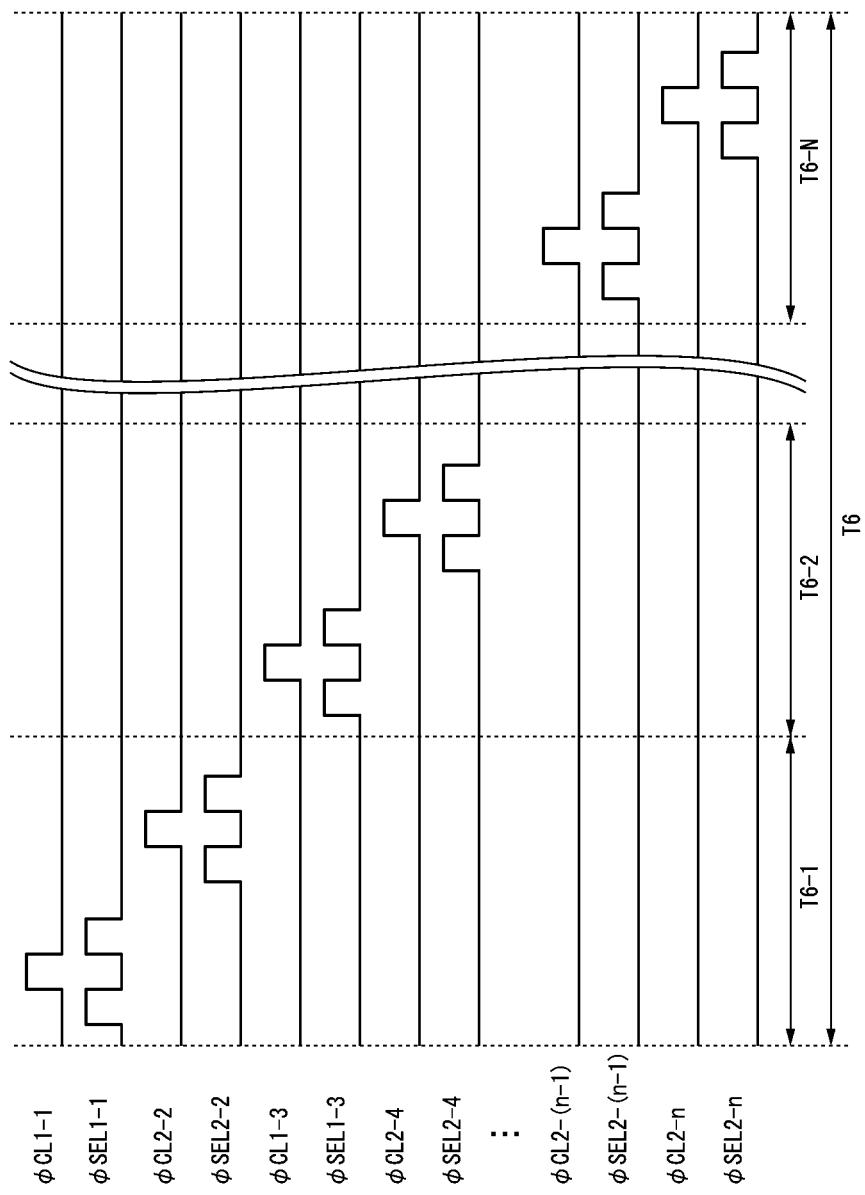
FIG. 8 is a timing chart illustrating an operation of a pixel included in the imaging apparatus according to the first embodiment of the present invention.

FIG. 7 illustrates control signals supplied to the pixel 1 in each row from the vertical scanning circuit 3. Hereinafter, an operation of the pixel 1 in periods T1 to T6 illustrated in FIG. 7 in units of two pixels illustrated in FIG. 4 will be described. One of the two pixels 1 belonging to the same group is referred to as a first pixel, and the other pixel is referred to as a second pixel. A start timing of the operation (a start timing of the period T1 in FIG. 7) is the same in each of the plurality of groups.

[Operation of Period T1]

First, the transfer pulses ΦTX1 and ΦTX2 change from being at an "L" (low) level to being at an "H" (high) level to turn the transfer transistors 102a and 102b on. At the same time, the FD reset pulse ΦRST changes from being at the "L" level to being at the "H" level to turn the FD reset transistor 104 on. Since the period T1 is a period common to all the pixels 1 (hereinafter described as all pixels), the photoelectric conversion elements 101a and 101b of all pixels are reset.

Subsequently, the transfer pulses ΦTX1 and ΦTX2 and the FD reset pulse ΦRST change from being at the "H" level to being at the "L" level to turn the transfer transistors 102a and 102b and the FD reset transistor 104 off. Accordingly, reset of the photoelectric conversion elements 101a and 101b of all the pixels ends, and exposures (accumulations of the signal charges) of all pixels start collectively (simultaneously).

[Operation of Period T2]

A period T2 is a period in an exposure period. First, the clamp and memory reset pulse ΦCL1 changes from being at an "L" level to being at an "H" level to turn the analog-memory reset transistor 109a on. Accordingly, the analog memory 110a is reset. At the same time, the sample pulse ΦSH1 changes from being at an "L" level to being at an "H" level to turn the sample transistor 108a on. Accordingly, a potential of the other terminal of the clamp capacitor 107 is reset to the supply voltage VDD and the sample transistor 108a starts the sample and hold of the potential of the other terminal of the clamp capacitor 107.

Subsequently, the FD reset pulse ΦRST changes from being at an "L" level to being at an "H" level to turn the FD reset transistor 104 on. Accordingly, the FD 103 is reset.

Subsequently, the FD reset pulse ΦRST changes from being at the "H" level to being at the "L" level to turn the FD reset transistor 104 off. Accordingly, the reset of the FD 103 ends. A timing to reset the FD 103 may be within the exposure period, but it is possible to further reduce noise due to leak current of the FD 103 by performing the reset of the FD 103 at a timing immediately before the end of the exposure period.

Subsequently, the clamp and memory reset pulse ΦCL1 changes from being at the "H" level to being at the "L" level to turn the analog-memory reset transistor 109a off. Accordingly, the reset of the analog memory 110a ends. At this time point, the clamp capacitor 107 clamps the amplified signal output from the first amplification transistor 105 (the amplified signal after the reset of the FD 103).

[Operation of Period T3]

First, the transfer pulse ΦTX1 changes from being at an "L" level to being at an "H" level to turn the transfer transistor 102a on. Accordingly, the signal charges accumulated in the photoelectric conversion element 101a are transferred to the FD 103 via the transfer transistor 102a and accumulated in the FD 103. Accordingly, the exposure (the accumulation of signal charges) of the first pixel ends. Exposure period 1 of FIG. 7 indicates the exposure period (a signal accumulation period) of the first pixel. Subsequently, the transfer pulse ΦTX1 changes from being at the "H" level to being at the "L" level to turn the transfer transistor 102a off.

Subsequently, the sample pulse ΦSH1 changes from the "H" level to the "L" level to turn the sample transistor 108a off. Accordingly, the sample transistor 108a ends the sample and hold of the potential of the other terminal of the clamp capacitor 107.

[Operation of Periods T4 and T5]

An operation of the periods T2 and T3 described above is the operation of the first pixel. An operation of the periods T4 and T5 corresponds to the operation of the periods T2 and T3 and is an operation of the second pixel. An operation of the period T4 is the same as the operation of the period T2. Since the operation of the period T5 is the same as the operation of the period T3, a description of the operation of the periods T4 and T5 will be omitted. Exposure period 2 of FIG. 7 indicates an exposure period (a signal accumulation period) of the second pixel.

Hereinafter, a change in a potential of the one terminal of the analog memory 110a of the first pixel will be described. The same applies to a change in a potential of the one terminal of the analog memory 110b of the second pixel.

When a change in the potential of the one terminal of the FD 103 as the signal charges are transferred from the photoelectric conversion element 101a to the FD 103 after the reset of the FD 103 has ended is ΔVfd and a gain of the first amplification transistor 105 is α1, a change ΔVamp1 in the potential of the source terminal of the first amplification transistor 105 as the signal charges are transferred from the photoelectric conversion element 101a to the FD 103 is α1×ΔVfd.

When a total gain of the sample transistor 108a and the analog memory 110a is α2, a change ΔVmem in the potential of the one terminal of the analog memory 110a due to the sample and hold of the sample transistor 108a after the signal charges are transferred from the photoelectric conversion element 101a to the FD 103 is α2×ΔVamp1, i.e., α1×α2×ΔVfd. Since the potential of the one terminal of the analog memory 110a at a time point at which the reset of the analog memory 110a has ended is the supply voltage VDD, the potential Vmem of the one terminal of the analog memory 110a sampled and held by the sample transistor 108a after the signal charges are transferred from the photoelectric conversion element 101a to the FD 103 is represented by the following Equation (1). In Equation (1), ΔVmem<0 and ΔVfd<0.

$$Vmem = VDD + \Delta Vmem \quad (1)$$
$$= VDD + \alpha 1 \times \alpha 2 \times \Delta Vfd$$

Further, α2 is represented by the following Equation (2). In Equation (2), CL is a capacitance value of the clamp capacitor 107, and CSH is a capacitance value of the analog memory 110a. In order to reduce a decrease in the gain, it is more desirable for the capacitance value CL of the clamp capacitor 107 to be greater than the capacitance value CSH of the analog memory 110a.

$$\alpha 2 = \frac{CL}{CL + CSH} \quad (2)$$

[Operation of Period T6]

In the period T6, the signals based on the signal charges accumulated in the analog memories 110a and 110b are sequentially read for each row. First, readout of a signal from the first pixel is performed. The selection pulse ΦSEL1 changes from being at an "L" level to being at an "H" level to turn the selection transistor 112a on. Accordingly, a signal based on the potential Vmem shown in Equation (1) is output to the vertical signal line 9 via the selection transistor 112a. Subsequently, the selection pulse ΦSEL1 changes from being at the "H" level to being at the "L" level to turn the selection transistor 112a off.

Subsequently, the clamp and memory reset pulse ΦCL1 changes from being at an "L" level to being at an "H" level to turn the analog-memory reset transistor 109a on. Accordingly, the analog memory 110a is reset. Subsequently, the clamp and memory reset pulse ΦCL1 changes from being at the "H" level to being at the "L" level to turn the analog-memory reset transistor 109a off.

Subsequently, the selection pulse ΦSEL1 changes from being at an "L" level to being at an "H" level to turn the selection transistor 112a on. Accordingly, a signal based on the potential of the one terminal of the analog memory 110a when the analog memory 110a is reset is output to the vertical signal line 9 via the selection transistor 112a. Subsequently, the selection pulse ΦSEL1 changes from being at the "H" level to being at the "L" level to turn the selection transistor 112a off.

The column processing circuit 4 generates a difference signal that takes a difference between the signal based on the potential Vmem shown in Equation (1) and the signal based on the potential of the one terminal of the analog memory 110a when the analog memory 110a has been reset. This difference signal is a signal based on a difference between the voltage Vmem shown in Equation (1) and the supply voltage VDD. Further, the difference signal is a signal based on the difference ΔVfd between the potential of the one terminal of the FD 103 immediately after the signal charges accumulated in the photoelectric conversion element 101a is transferred to the FD 103 and the potential of the FD 103 immediately after the one terminal of the FD 103 is reset. Thus, it is possible to obtain a signal component based on the signal charges accumulated in the photoelectric conversion element 101a, from which a noise component due to the reset of the analog memory 110a and a noise component due to the reset of the FD 103 have been suppressed.

The signal output from the column processing circuit 4 is output to the horizontal signal line 10 by the horizontal readout circuit 5. The output amplifier 6 processes the signal output to the horizontal signal line 10 and outputs a resultant signal from the output terminal 11 as a pixel signal. Then, the readout of the signal from the first pixel ends.

Subsequently, the readout of the signal from the second pixel is performed. Since the readout of the signal from the second pixel is the same as the readout of the signal from the first pixel, a description of the readout of the signal from the second pixel will be omitted.

A period to read the signal from the pixel 1 in the period T6 differs in each row. FIG. 8 illustrates an operation of each pixel 1 in the period T6. In FIG. 8, the clamp and memory reset pulse ΦCL1 of the pixel 1 of an odd row (row i), which is the first pixel, is ΦCL1-*i*, and the selection pulse ΦSEL1 is ΦSEL1-*i*. Further, in FIG. 8, the clamp and memory reset pulse ΦCL2 of the pixel 1 of an even row (row j), which is the second pixel, is ΦCL2-*j*, and the selection pulse ΦSEL2 is ΦSEL2-*j*. Further, in FIG. 8, a case in which the number n of rows is an even number is illustrated.

The period T6 includes periods T6-1, T6-2, . . . , T6-N. In the period T6-1, signals are read from pixels 1 in a first row and a second row. An operation of the pixel 1 in the period T6-1 is the same as the operation of the pixel 1 in the period T6 in FIG. 7. In the period T6-2, signals are read from pixels of a third row and a fourth row. An operation of the pixel 1 in the period T6-2 is also the same as the operation of the pixel 1 in the period T6 in FIG. 7. Even for the pixels 1 of a fourth row and subsequent rows, the same operation is performed for each row. In the period T6-N, signals are read from pixels 1 of the last row (an nth row). The operation of the pixel 1 in the period T6-N is also the same as the operation of the pixel 1 in the period T6 in FIG. 7. Through the above operation, signals are read from all the pixels.

In the above operation, the FD 103 must hold the signal charges transferred from photoelectric conversion elements 101a and 101b to the FD 103 until to a readout timing of each pixel 1. If a noise is generated during a period in which the FD 103 holds the signal charges, the noise is superimposed on the signal charges held by the FD 103, thus degrading signal quality (S/N).

Primary causes of the noise generated during the period in which the FD 103 holds the signal charges (hereinafter referred to as a holding period) are charges due to leak current of the FD 103 (hereinafter described as leak charges) and charges due to light incident on portions other than the photoelectric conversion elements 101a and 101b (hereinafter referred to as light charges). When the leak charges and the light charges generated in a unit time are qid and qpn, respectively, and a length of the holding period is tc, noise charges Qn generated during the holding period become (qid+qpn) tc.

It is assumed that the capacitance of the FD 103 is Cfd, the capacitance of the analog memories 110a and 110b is Cmem, and a ratio of Cfd and Cmem (Cmem/Cfd) is A. It is also assumed that a gain of the first amplification transistor 105 is $\alpha 1$, and a total gain of the analog memories 110a and 110b and the sample transistors 108a and 108b is $\alpha 2$, as described above. When the signal charges generated in the photoelectric conversion elements 101a and 101b during the exposure period are Qph, the signal charges held in the analog memories 110a and 110b after the end of the exposure period become $A \times \alpha 1 \times \alpha 2 \times Qph$.

The signal based on the signal charges transferred from the photoelectric conversion element 101 to the FD 103 is sampled and held by the sample transistor 108 and stored in the analog memory 110 in the period T3 or T5. Accordingly, a time from the signal charges being transferred to the FD 103 to the signal charges being stored in the analog memory 110 is short and the noise generated in the FD 103 is negligible. Assuming that the noise generated in the period in which the analog memory 110 holds the signal charges is Qn as described above, S/N becomes $A \times \alpha 1 \times \alpha 2 \times Qph/Qn$.

Meanwhile, as in the prior art described in Patent Document 2, S/N when the signal charges held in the capacitor accumulation units are read from the pixel via the amplification transistor becomes Qph/Qn. Therefore, S/N of the present embodiment is $A \times \alpha 1 \times \alpha 2$ times the S/N of the prior art. It is possible to reduce degradation of signal quality by setting the capacitance value of the analog memories 110a and 110b so that $A \times \alpha 1 \times \alpha 2$ is greater than 1 (e.g., by setting the capacitance value of the analog memory 110 to be sufficiently greater than the capacitance value of the FD 103).

In the first operation example, the start timing of the exposure is the same in all the pixels, but an end timing of the exposure of the respective pixels 1 in the same group differs, as shown in exposure periods 1 and 2 of FIG. 7. However, a difference in the exposure period is small.

<Second Operation Example>

Figure 9:
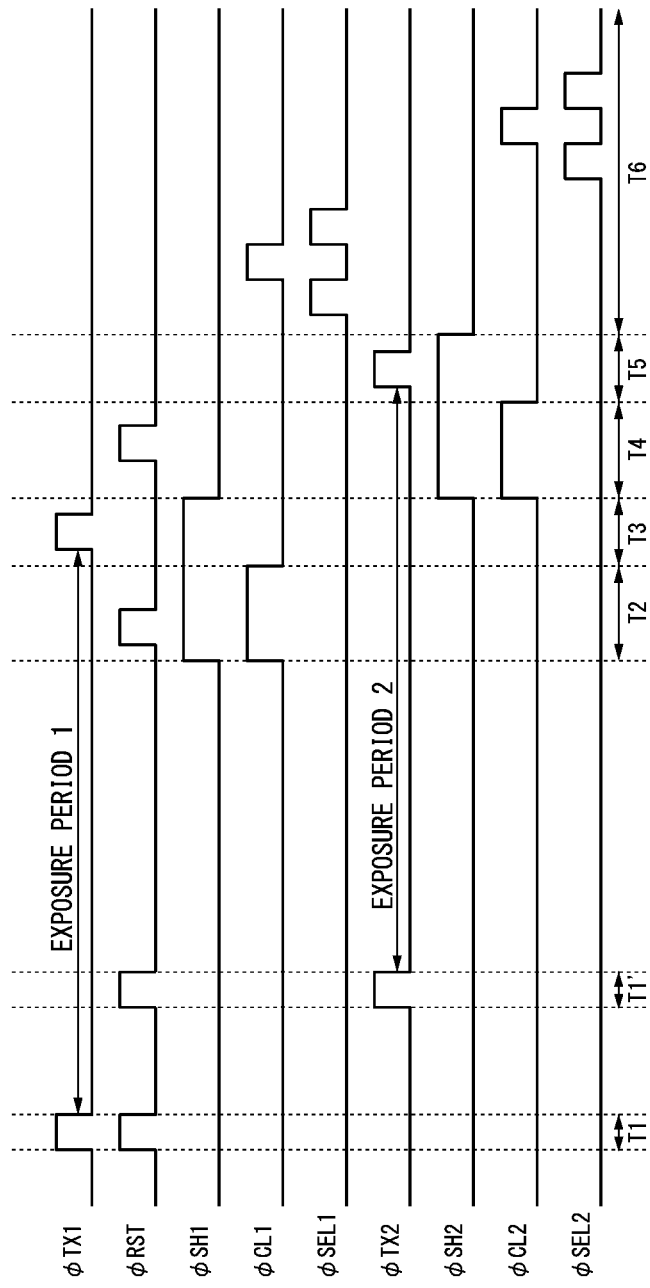
FIG. 9 is a timing chart illustrating the operation of a pixel included in the imaging device according to the first embodiment of the present invention.

FIG. 9 illustrates control signals supplied to the pixel 1 in each row from the vertical scanning circuit 3. Hereinafter, an operation of the pixel 1 in periods T1 to T6 illustrated in FIG. 9 in units of two pixels illustrated in FIG. 4 will be described. One pixel 1 of the two pixels 1 belonging to the same group is referred to as a first pixel, and the other pixel is referred to as a second pixel. A start timing of the operation (a start timing of the period T1 in FIG. 9) is the same in each of the plurality of groups described above. Hereinafter, only portions different from those in the first operation example will be described.

Operations in the periods T1 and T1' differ from those in the operation illustrated in FIG. 7. In the period T1, reset of the photoelectric conversion element 101a is performed only for the first pixel. Further, in the period T1', reset of the photoelectric conversion element 101b is performed only for the second pixel. Exposure period 1 of FIG. 9 indicates an exposure period (a signal accumulation period) of the first pixel, and exposure period 2 indicates an exposure period (a signal accumulation period) of the second pixel.

A start timing of the period T1' is set so that lengths of exposure period 1 and exposure period 2 are the same. Accordingly, in the second operation example, since lengths of the exposure periods of all pixels are the same, it is possible to obtain a higher quality signal. Further, in the second operation example, it is possible to reduce deterioration of signal quality, as in the first operation example.

Figure 10:
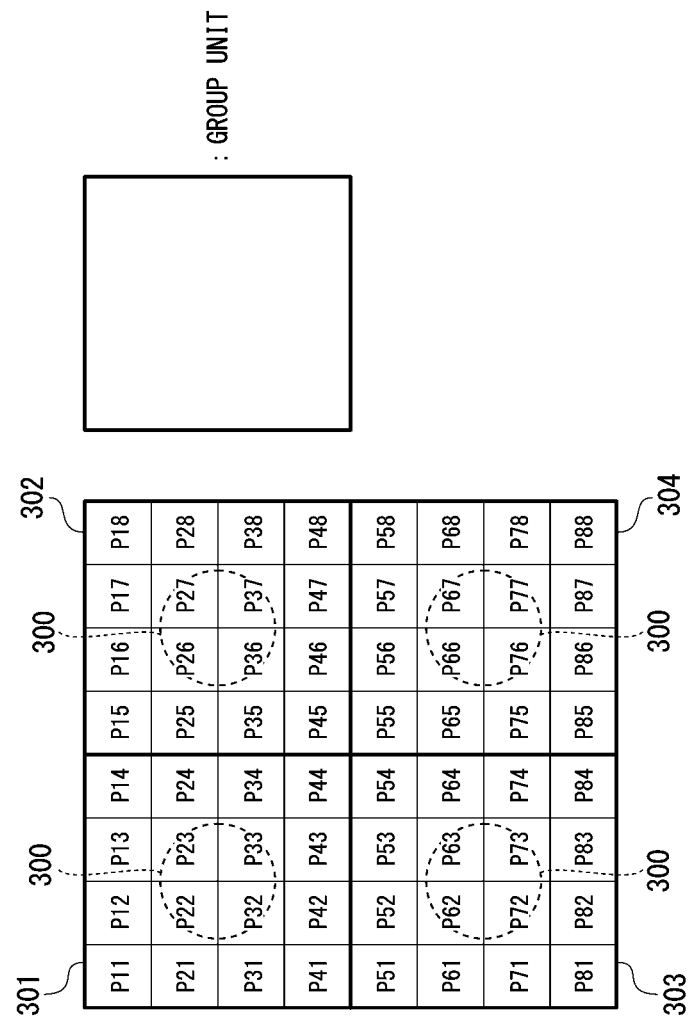
FIG. 10 is a schematic diagram illustrating an arrangement example of connection portions included in the imaging apparatus according to the first embodiment of the present invention.

Next, arrangement positions of the connector including the micropads 22, the micro bumps 24, the micropads 23, and the pixels 1 will be described, FIG. 10 illustrates an example of 64 pixels 1 in 8 rows×8 columns in which 16 pixels in 4 rows×4 columns constitute one group as an example. In FIG. 10, a number Pnm (n: 1 to 8 and m: 1 to 8) for convenience is assigned to each pixel 1. The digit n of the number Pnm indicates a row number, and the digit m indicates a column number.

In the shown example, 16 pixels 1 having pixel numbers P11 to P14, P21 to P24, P31 to P34, and P41 to P44 constitute a group 301. Further, 16 pixels 1 having pixel numbers P15 to P18, P25 to P28, P35 to P38, and P45 to P48 constitute a group 302. Further, 16 pixels 1 having pixel numbers P51 to P54, P61 to P64, P71 to P74, and P81 to P84 constitute a group 303. Further, 16 pixels 1 having pixel numbers P55 to P58, P65 to P68, P75 to P78, and P85 to P88 constitute a group 304.

Since one photoelectric conversion element corresponds to one pixel 1, a group to which the pixel 1 belongs is the same as a group to which the photoelectric conversion element belongs. A plurality of photoelectric conversion elements of the 16 pixels 1 in the same group share the FD 103, the FD reset transistor 104, the first amplification transistor 105, the current source 106, and the clamp capacitor 107.

Further, since the plurality of photoelectric conversion elements of the pixels 1 included in the respective groups 301 to 304 share the FD 103, the FD reset transistor 104, the first amplification transistor 105, the current source 106, and the clamp capacitor 107, one connector 300 is arranged for each of the groups 301 to 304. In the group 301, the connector 300 is arranged in positions of pixel numbers P22, P23, P32 and P33. Further, in the group 302, the connector 300 is arranged in positions of pixel numbers P26, P27, P36 and P37. Further, in the group 303, the connector 300 is arranged in positions of pixel numbers P62, P63, P72, and P73. Further, in the group 304, the connector 300 is arranged in the positions of pixel numbers P66, P67, P76, and P77.

Further, an arrangement pattern of the connector 300 is not limited to a pattern illustrated in FIG. 10, and the number of pixels 1 constituting a group may be any number. For example, only one pixel 1 may constitute a group and the one pixel may be connected to the second substrate 21 using one connector 300.

Next, an arrangement position of the dummy connector will be described. As described above, the connector 300 (a real connector) is arranged in a region in which the pixel 1 is arranged. Further, a chip of a multilayer substrate (e.g., a solid-state imaging device or an imaging apparatus) in which the first substrate 20 in which the photoelectric conversion elements 101 are arranged and the second substrate 21 in which some or all of circuits performing processing of signals output by the photoelectric conversion elements 101 are arranged are connected using the connection units 300 is manufactured. As a process order of manufacturing this chip of a multilayer substrate, an order of connecting a semiconductor wafer (a first semiconductor wafer) having the first substrate 20 formed therein and a semiconductor wafer (a second semiconductor wafer) having the second substrate 21 formed therein using the connection units 300 and then cutting a resultant wafer into a chip through dicing (singulation) is considered. Some or all of the circuits performing processing of signals output by the photoelectric conversion elements 101 are referred to as peripheral circuits. Further, the peripheral circuit may include a wiring circuit.

In this case, since the connectors 300 are arranged in the region in which the pixels 1 are arranged, a mechanical strength to connect the first substrate 20 and the second substrate 21 is high. On the other hand, the peripheral connectors including the micropads 25, the microbumps 27, and the micropads 26 are arranged in the regions (e.g., the peripheral circuit region in which the peripheral circuits are arranged or the empty region in which nothing is arranged) other than the region in which the pixels 1 are arranged, as illustrated in FIGS. 3A and 3B, but the number of peripheral connectors is smaller than the number of connectors 300. Accordingly, a mechanical strength to connect the first substrate 20 with the second substrate 21 is low in the regions other than the region in which the pixels 1 are arranged.

Accordingly, when dicing is performed to cut out chips from the semiconductor wafer, the chip is likely to be cracked and chipped, failing to withstand intensity of the dicing. Further, the semiconductor wafer is not completely flat, but slightly distorted. When semiconductor wafers are connected, the semiconductor wafers are connected while suppressing distortion through weighting on a flat stage. For this reason, the distortion is recovered after the wafer is cut into chips, and the bumps are likely to be disconnected.

Thus, in the present embodiment, the dummy connectors are arranged in the regions (e.g., the peripheral circuit region and the empty region) other than the region in which the pixels 1 are arranged. Even in the regions other than the region in which the pixels 1 are arranged, the mechanical strength to connect the first substrate 20 and the second substrate 21 increases. A configuration of the dummy connector is the same as the configuration of the connector 300. That is, the micropads arranged in the first substrate 20, the microbumps, and the micropads arranged in the second substrate 21 constitute the dummy connectors connecting the first substrate 20 with the second substrate 21.

The dummy connectors are formed in a substantially columnar shape between the first substrate 20 and the second substrate 21.

Figure 11A:
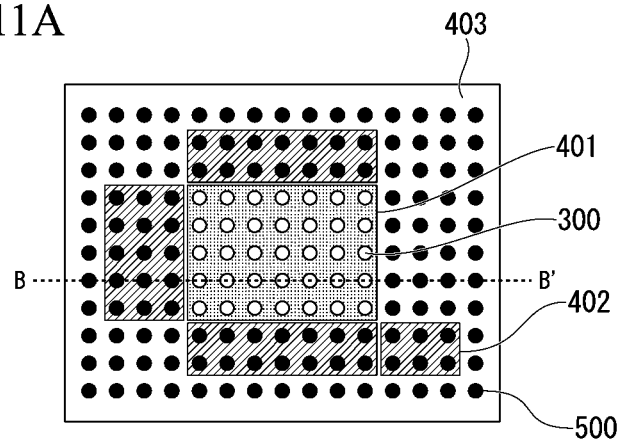
FIG. 11A is a schematic view illustrating a planar structure and a cross-sectional structure of a substrate in which a first substrate and a second substrate are bonded according to the first embodiment of the present invention.
Figure 11B:
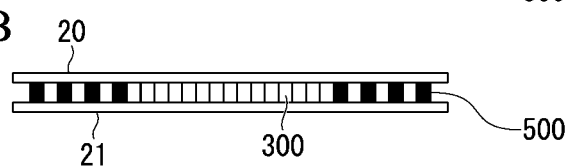
FIG. 11B is a schematic view illustrating a planar structure and a cross-sectional structure of a substrate in which a first substrate and a second substrate are bonded according to the first embodiment of the present invention.

FIGS. 11A and 11B illustrate a planar structure (FIG. 11A) and a cross-sectional structure (FIG. 11B) of a substrate in which the first substrate 20 and the second substrate 21 are bonded. A cross-sectional view illustrated in FIG. 11B is a cross-sectional view taken along line B-B' illustrated in FIG. 11A. In an example illustrated in FIG. 11A, a pixel region 401 in which the pixels 1 are arranged, a peripheral circuit region 402 in which peripheral circuits are arranged, and an empty region 403 in which nothing is arranged are included in a region of the first substrate 20.

Further, connectors 300 (real connectors) for transferring signals between the first substrate 20 and the second substrate 21 are arranged in the pixel region 401. However, the connectors 300 are not arranged in the peripheral circuit region 402 and the empty region 403, which are regions other than the pixel region 401. As illustrated in FIG. 11A, dummy connectors 500 that do not perform transfer of signals are arranged in the peripheral circuit region 402 and the empty region 403, which are regions other than the pixel region 401.

Further, in the illustrated example, an arrangement interval of the dummy connectors 500 is the same as an arrangement interval of the connectors 300 arranged in the pixel region 401. For example, when a pixel pitch of the pixels 1 is 5 μm and 16 pixels 1 in 4 rows and 4 columns use the same connector 300, the connectors 300 and the dummy connectors 500 are arranged at intervals of 20 μm.

A method of manufacturing the chip formed as described above is performed through the following process.

The first substrate 20 including circuit elements and the second substrate 21 including the output amplifier 6 are bonded via the connectors 300.

Also, a connector arranging process is performed to arrange the dummy connectors 500 supporting the first and second bonded substrates 20 and 21 in the regions other than the region in which the pixels 1 are arranged, i.e., in the regions in which the connectors 300 are not arranged.

Through this process, a chip is manufactured.

Thus, as the dummy connectors 500 that do not transfer signals are arranged in the regions (e.g., the peripheral circuit region 402 and the empty region 403) other than the pixel region 401, mechanical connection strength of the first substrate 20 and the second substrate 21 increases. Accordingly, cracks and chipping when the chip is cut out through dicing can be reduced or prevention of the disconnection due to distortion of the substrate can be reduced. Thus, it is possible to manufacture a high-yield chip of a multilayer substrate (e.g., a solid-state imaging device or an imaging apparatus).

Further, it is possible to reduce influence of peripheral circuits even when chipping occurs.

In the example described above, the dummy connectors 500 do not perform transfer of signals between the first substrate 20 and the second substrate 21. However, for example, the dummy connectors 500 may be used as a power line or a ground line of the first substrate 20 and the second substrate 21 to enhance the power and the ground of the first substrate 20 and the second substrate 21.

Further, the arrangement of the dummy connectors 500 is not limited to the example shown in FIGS. 11A and 11B and may be any arrangement capable of increasing the mechanical connection strength of the first substrate 20 and the second substrate 21.

Figure 12:
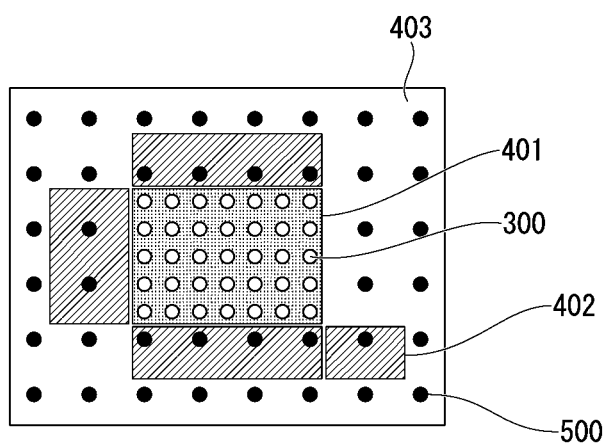
FIG. 12 is a schematic view illustrating a planar structure of a substrate in which a first substrate and a second substrate are bonded according to the first embodiment of the present invention.

FIG. 12 is a plan view illustrating a planar structure of a substrate in which the first substrate 20 and the second substrate 21 are bonded. In an example illustrated in FIG. 12, an arrangement interval of the dummy connectors 500 is greater than that in the example illustrated in FIGS. 11A and 11B. A pixel region 401, a peripheral circuit region 402, and an empty region 403 included in a region of the first substrate 20 are the same as those in the example illustrated in FIGS. 11A and 11B. Further, an arrangement of the connectors 300 is the same as that in the example illustrated in FIGS. 11A and 11B. In the shown example, an arrangement interval of the dummy connectors 500 is twice the arrangement interval of the connectors 300. Even in this case, since mechanical connection strength of the first substrate 20 and the second substrate 21 increases, cracks and chipping when the chip is cut out through dicing can be reduced or prevention of the disconnection due to distortion of the substrate can be reduced. Accordingly, it is possible to manufacture a high-yield chip of a multilayer substrate (e.g., a solid-state imaging device or an imaging apparatus).

(Second Embodiment)

Next, a second embodiment of the present invention will be described. There is a method of bonding a semiconductor wafer having a first substrate 20 formed therein and a semiconductor wafer having a second substrate 21 formed therein through weighting of the semiconductor wafers when the semiconductor wafers are bonded. When the semiconductor wafers are bonded in this way, if there are elements constituting circuits, such as transistors and wirings, under the dummy connectors 500 arranged in the peripheral circuit region 402, there is a possibility of the circuit components being altered due to the weighting and circuit characteristics being changed.

Figure 13:
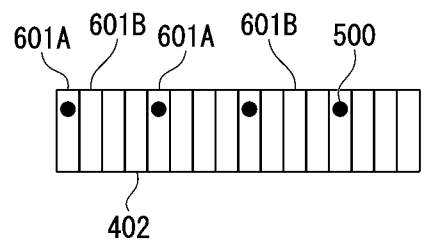
FIG. 13 is a schematic diagram illustrating an arrangement of column ADC circuits according to a second embodiment of the present invention.

In peripheral circuits included in a solid-state imaging device (peripheral circuits that are some or all of circuits that perform processing of a signal output by the photoelectric conversion element 101), the same circuits are arranged regularly at a pixel pitch or at a pitch that is an integer multiple of the pixel pitch in each column. In an example illustrated in FIG. 13, column ADC circuits (analog-digital conversion circuits) 601A and 601B are arranged regularly at a pixel pitch or at a pitch being an integer multiple of the pixel pitch in each column. Accordingly, a circuit in which the dummy connector 500 is present and a circuit in which the dummy connector 500 is not present have different circuit characteristics due to an interval between the dummy bumps arranged in the peripheral circuit region 402, which may cause a fixed pattern noise. For example, in the example illustrated in FIG. 13, the dummy connector 500 is present in the column ADC circuit 601A included in the peripheral circuit. Since the dummy connector 500 is not present in the column ADC circuit 601B, the column ADC circuit 601A and the column ADC circuit 601B have different circuit characteristics, which may cause the fixed pattern noise.

Therefore, in the present embodiment, in order for the circuits included in the peripheral circuit to have the same circuit characteristics, an arrangement of the dummy connectors 500, which are arranged in the peripheral circuit region 402, is considered. An arrangement of the dummy connectors 500 to be arranged in a region other than the peripheral circuit region 402 is the same as the arrangement of the dummy connectors 500 in the first embodiment.

Figure 14:
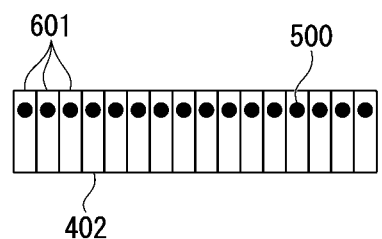
FIG. 14 is a schematic diagram illustrating an arrangement pattern of dummy connector arranged in a peripheral circuit region according to the second embodiment of the present invention.

FIG. 14 is a schematic diagram illustrating an arrangement pattern of the dummy connectors 500 arranged in the peripheral circuit region 402 in the present embodiment. In the illustrated example, column ADC circuits 601 are arranged in the peripheral circuit region 402. Further, the dummy connector 500 is arranged on each column ADC circuit 601. Since the respective column ADC circuits 601 have the same circuit characteristics by arranging the dummy connectors 500 on all the column ADC circuits 601, it is possible to suppress generation of the fixed pattern noise.

Figure 15:
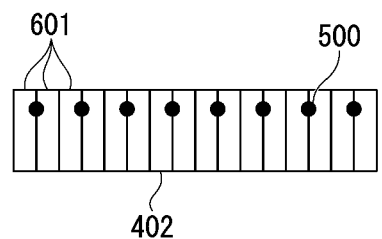
FIG. 15 is a schematic diagram illustrating an arrangement pattern of dummy connector arranged in a peripheral circuit region according to the second embodiment of the present invention.

The arrangement pattern of the dummy connectors 500 is not limited to the arrangement pattern illustrated in FIG. 14, and may be any pattern capable of suppressing the generation of the fixed pattern noise. FIG. 15 is a schematic diagram illustrating an arrangement pattern of the dummy connectors 500 arranged in the peripheral circuit region 402 in the present embodiment. In the illustrated example, the dummy connector 500 is arranged in the middle of two column ADC circuits 601. In this case, the two column ADC circuits 601 are configured so that a circuit pattern of the two column ADC circuits 601 is symmetric to the dummy connector 500. With this configuration, an arrangement position of the dummy connector 500 is on the same element or wiring in the left column ADC circuit 601 and the right column ADC circuit 601. Accordingly, since the dummy connector 500 is on the same element or wiring in each column ADC circuit 601, the difference between the characteristics of the respective column ADC circuits 601 becomes substantially the same and the generation of the fixed pattern noise can be suppressed.

If the dummy connector 500 is arranged in each circuit arranged in the peripheral circuit region 402, i.e., at a pixel pitch or at a pitch that is an integer multiple of the pixel pitch as described above, a circuit characteristic difference due to the arrangement positions of the dummy connectors 500 is not generated. For example, when the circuit arranged in the peripheral circuit region 402 is the column ADC circuit 601, a resistance value, a capacitance value or a characteristic of the transistors in the column ADC circuit 601 is uniform in each column. Accordingly, it is possible to reduce the characteristic difference of the peripheral circuit due to the arrangement positions of the dummy connectors 500. It is also possible to suppress degradation of the signal output from the photoelectric conversion element 101, i.e., deterioration of image quality of an image captured by the solid-state imaging device.

In the example described above, the case in which the elements or the wirings constituting the circuits are present in the arrangement positions of the dummy connectors 500 has been described. However, it is also possible to reduce a change in the circuit characteristics by arranging the dummy connectors 500 in positions that do not affect the elements or wirings in the circuits. Further, while the description has been given using the column ADC circuit 601 as an example of the circuit included in the peripheral circuit region 402 in the example described above, the present invention is not limited thereto. For example, the circuit is not limited to the horizontal scanning circuit such as the column ADC circuit 601, and even when the dummy connectors 500 are arranged in the peripheral circuit region 402 including a plurality of unit circuits, variations in characteristics of the unit circuits can be reduced and the generation of the fixed pattern noise can be suppressed.

(Third Embodiment)

Hereinafter, a third embodiment of the present invention will be described. A difference between the first embodiment and the present embodiment is that, in the present embodiment, the dummy connectors 500 are not arranged in the peripheral circuit region 402. Other configurations are the same as those of the first embodiment.

Figure 16:
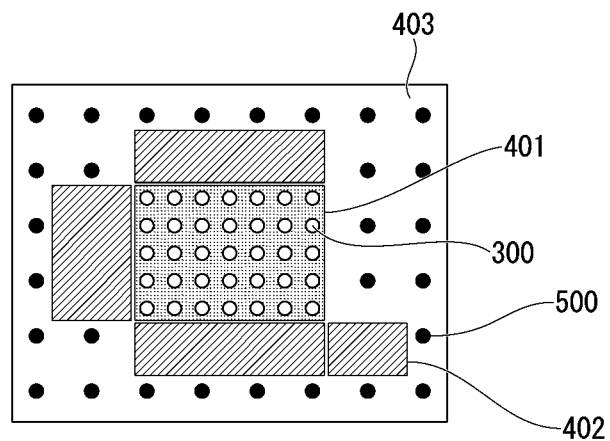
FIG. 16 is a schematic view illustrating a planar structure of a substrate in which a first substrate and a second substrate are bonded according to a third embodiment of the present invention.

FIG. 16 is a plan view illustrating a planar structure of a substrate in which the first substrate 20 and the second substrate 21 are bonded. A difference between an example illustrated in FIG. 16 and the example illustrated in FIGS. 11A and 11B is that, in the example illustrated in FIG. 16, the dummy connectors 500 are not arranged in the peripheral circuit region 402. The dummy connectors 500 are arranged in an empty region 403. By not arranging the dummy connectors 500 in the peripheral circuit region 402 but arranging the dummy connectors 500 only in the empty region 403 in this way, it is possible to prevent a change in characteristics of circuits arranged in the peripheral circuit region 402 while increasing mechanical connection strength between the first substrate 20 and the second substrate 21. Further, it is unnecessary to determine the arrangement of the dummy connectors 500 in consideration of the arrangement of the circuits arranged in the peripheral circuit region 402, thus improving the degree of freedom of a circuit layout.

Figure 17:
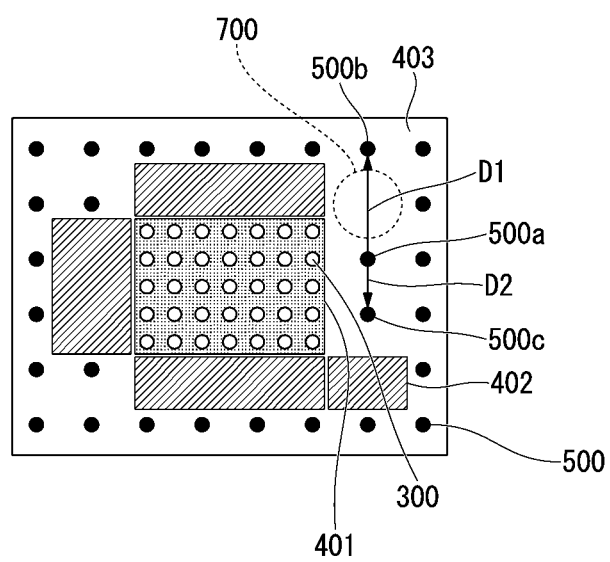
FIG. 17 is a schematic view illustrating a planar structure of a substrate in which a first substrate and a second substrate are bonded according to the third embodiment of the present invention.

A method of arranging the dummy connectors 500 is not limited to the example illustrated in FIG. 16. FIG. 17 is a plan view illustrating a planar structure of a substrate in which the first substrate 20 and the second substrate 21 are bonded. In an example illustrated in FIG. 17, an arrangement of some dummy connectors 500 is omitted, unlike the example illustrated in FIGS. 11A and 11B. In the illustrated example, an arrangement of the dummy connector 500 to be arranged in a region 700 included in the empty region 403 is omitted.

In other words, in this example, a distance between adjacent dummy connectors 500 is changed. For concrete description, one of a plurality of dummy connectors 500 is defined as a dummy connector 500a, and different directions D1 and D2 from the dummy connector 500a, which is a start point, are defined. The dummy connector 500 adjacent in the direction D1 with respect to the dummy connector 500a is defined as a connector 500b, and the dummy connector 500 adjacent in the direction D2 with respect to the dummy connector 500a is defined as a connector 500c. In this case, the distance between the dummy connector 500a and the dummy connector 500b is set to be greater than a distance between the dummy connector 500a and the dummy connector 500c.

Accordingly, it is possible to reduce mechanical connection strength between a semiconductor wafer having the first substrate 20 formed therein and a semiconductor wafer having the second substrate 21 formed therein. Specifically, it is possible to reduce the mechanical connection strength of the two semiconductor wafers between the dummy connectors 500a and 500b. It is also possible to reduce the pressure to be applied to the semiconductor wafer having the first substrate 20 formed therein and the semiconductor wafer having the second substrate 21 formed therein.

Figure 18:
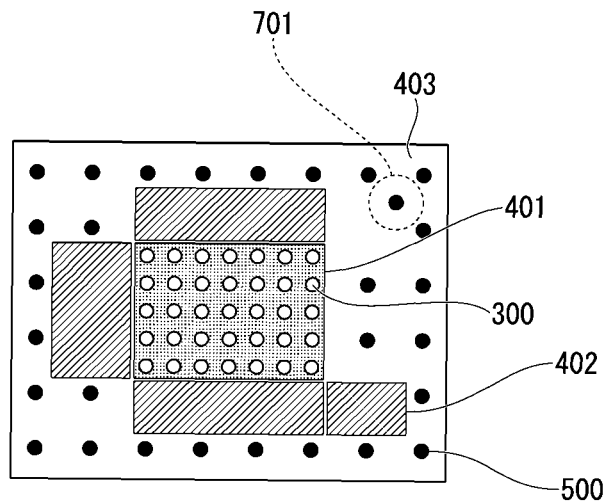
FIG. 18 is a schematic view illustrating a planar structure of a substrate in which a first substrate and a second substrate are bonded according to the third embodiment of the present invention.

FIG. 18 is a plan view illustrating a planar structure of the substrate in which the first substrate 20 and the second substrate 21 are bonded. In an example illustrated in FIG. 18, arrangement positions of some dummy connectors 500 are shifted from arrangement positions at equal intervals, unlike the example illustrated in FIGS. 11A and 11B. In the illustrated example, arrangement positions of dummy connectors 500 arranged in a region 701 included in the empty region 403 are shifted from arrangement positions at equal intervals. Accordingly, it is possible to efficiently enhance connection strength of a region in which mechanical strength of the connection between the semiconductor wafer having the first substrate 20 formed therein and the semiconductor wafer having the second substrate 21 formed therein is low. Further, accordingly, when the semiconductor wafer having the first substrate 20 formed therein and the semiconductor wafer having the second substrate 21 formed therein are bonded and then diced, it is possible to prevent the semiconductor wafer having the first substrate 20 formed therein and the semiconductor wafer having the second substrate 21 formed therein from being disconnected from each other.

(Fourth Embodiment)

Hereinafter, a fourth embodiment of the present invention will be described.

A difference between the first embodiment and the present embodiment is that, in the present embodiment, the dummy connector 500 is connected to a ground wiring provided in the first substrate 20 or the second substrate 21.

Figure 19:
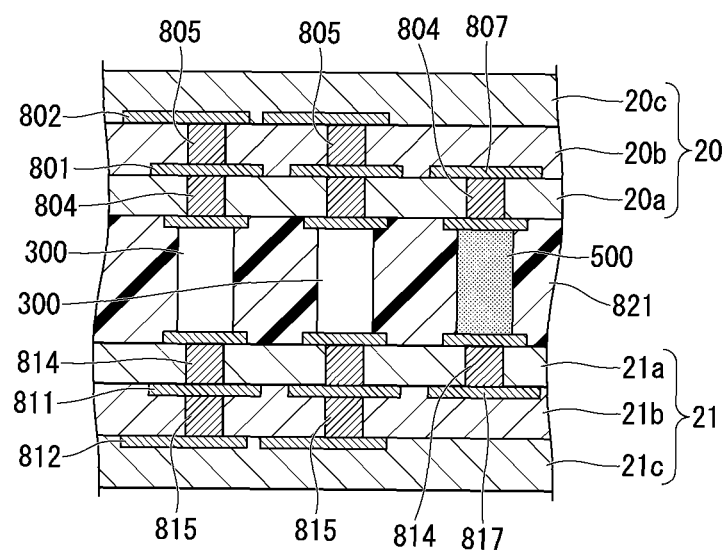
FIG. 19 is a cross-sectional view of primary portions of a substrate in which a first substrate and a second substrate are bonded according to a fourth embodiment of the present invention.

As illustrated in FIG. 19, in this example, the first substrate 20 is formed by stacking a semiconductor substrate (not shown) and interlayer insulating films 20a, 20b, and 20c. Connection wirings 801 and 802 are formed between the interlayer insulating films 20a and 20b and between the interlayer insulating films 20b and 20c, respectively. Vias 804 and 805 are formed in the interlayer insulating films 20a and 20b. Connectors 300 are connected to a photoelectric conversion unit (not shown) via the vias 804 and 805, the connection wirings 801 and 802 and vias (not shown).

A ground wiring 807 (a first ground wiring) is provided between the interlayer insulating films 20a and 20b. A dummy connector 500 is connected to the ground wiring 807 via the via 804.

Similarly, the second substrate 21 is formed by stacking a semiconductor substrate (not shown) and interlayer insulating films 21a, 21b and 21c. Connection wirings 811 and 812 are formed between the interlayer insulating films 21a and 21b and between the interlayer insulating films 21b and 21, respectively. The vias 814 and 815 are formed in the interlayer insulating films 21a and 21b. The connector 300 is connected to the above-described output amplifier 6 via the vias 814 and 815 and the connection wirings 811 and 812.

A ground line 817 (a second ground wiring) is provided between the interlayer insulating films 21a and 21b. The dummy connector 500 is connected to the ground wiring 817 via the via 814.

The ground wirings 807 and 817 may be formed of a metal such as Al or Cu through the same semiconductor process as the connection wirings 801 and 811.

A resin layer 821 is provided between the interlayer insulating film 20a and the interlayer insulating film 21a to cover outer peripheral surfaces of the connector 300 and the dummy connector 500.

In the manufacturing method of the present embodiment of manufacturing a chip formed in this manner, the ground wiring 807 is formed in the first substrate 20 and the ground wire 817 is formed in the second substrate 21 using a known photolithography technology prior to performing the connector arranging process in the first embodiment. The vias 804, 805, 814 and 815 and the like are formed in the substrates 20 and 21.

Next, in the connector arranging process, when the dummy connector 500 is arranged, the dummy connector 500 is connected to the ground wirings 807 and 817 via the vias 804 and 814.

The substrates 20 and 21 connected to each other by the connectors 300 and the dummy connectors 500 may be subjected to a process such as dry etching in a state in which one (e.g., the second substrate 21) of the substrates 20 and 21 is attached to a stage of a manufacturing apparatus. In dry etching, since the substrates are processed by an active gas, a temperature of the first substrate 20 becomes high. Heat of the second substrate 21 attached to the stage can be dissipated directly toward the manufacturing apparatus even when its temperature rises. However, heat of the first substrate 20 cannot be dissipated toward the manufacturing apparatus other than via the second substrate 21 when its temperature rises. Further, since the vicinity of the substrates 20 and 21 is normally in a vacuum state, the temperature of the first substrate 20 easily rises at the time of dry etching.

In the chip and the chip manufacturing method of the present embodiment, both ends of the dummy connector 500 are connected to the ground wirings 807 and 817. Accordingly, it is possible to effectively transfer heat of the first heated substrate 20 to the second substrate 21 via the ground wiring 807, the dummy connector 500 and the ground wiring 817, which have high thermal conductivity. That is, it is possible to increase the efficiency of heat transfer between the first substrate 20 and the second substrate 21. Thus, it is possible to dissipate the heat generated in the first substrate 20 toward the manufacturing apparatus via the second substrate 21.

When linear expansion coefficients of respective members constituting the first substrate 20 differ from each other, cracking or peeling may occur at an interface between the members when the first substrate 20 is heated. Further, the first substrate 20 expands due to temperature rise, but the second substrate 21 expands little because its heat is dissipated. Accordingly, cracks and peeling at the interface between the members or cracks in the member may occur. It is possible to decrease the temperature of the first substrate 20 by increasing the efficiency of heat transfer between the first substrate 20 and the second substrate 21 in the chip of the present embodiment, thereby suppressing occurrence of peeling or cracks described above.

Since the ground wiring is generally formed to be greater than other connection wirings, heat can be effectively delivered between the first substrate 20 and the ground wiring 807 and between the second substrate 21 and the ground wiring 817.

These effects can be similarly obtained even when the first substrate 20 is mounted on the stage of the manufacturing apparatus.

In the present embodiment, the dummy connector 500 is connected to the ground wiring 807 provided in the first substrate 20 and the ground wiring 817 provided in the second substrate 21. However, the dummy connector 500 may be connected to only one of the ground wirings 807 and 817.

Even with this configuration, heat transfer efficiency between one of the substrates 20 and 21 and the dummy connector 500 increases. As a result, heat transfer efficiency between the first substrate 20 and the second substrate 21 is possible to be increased.

(Fifth Embodiment)

Next, a fifth embodiment of the present invention will be described.

A difference between the fourth embodiment and the present embodiment is that, in the present embodiment, the dummy connectors 500 are connected to a heat conduction pattern provided in the first substrate 20 or the second substrate 21. Another difference is that at least some of the dummy connectors 500 connected to the heat conduction patterns and the heat conduction patterns are diced and removed.

Figure 20:
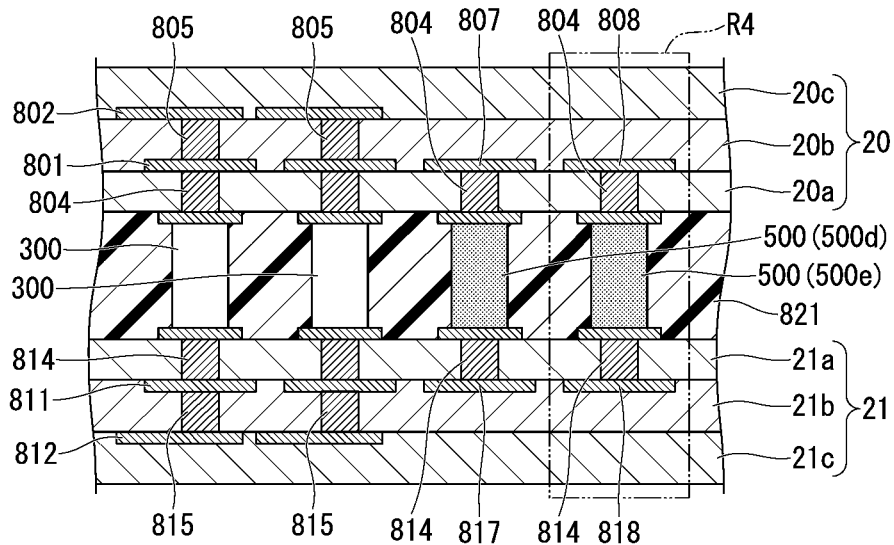
FIG. 20 is a cross-sectional view of primary portions of a substrate in which a first substrate and a second substrate are bonded according to a fifth embodiment of the present invention.

As illustrated in FIG. 20, a heat conduction pattern (a first heat conduction pattern) 808 is provided between the interlayer insulating films 20a and 20b of the first substrate 20. The heat conduction pattern 808 is insulated from circuit elements including a photoelectric conversion unit, which are not shown, by the interlayer insulating films 20a and 20b. A heat conduction pattern 818 (a second heat conduction pattern) is provided between the interlayer insulating films 21a and 21b of the second substrate 21. The heat conduction pattern 818 is insulated from the output amplifier 6 by the interlayer insulating films 21a and 21b. The heat conduction patterns 808 and 818 may be formed of a metal such as Al or Cu through the same semiconductor process as the connection wirings 801 and 811.

Each of the dummy connectors 500d that are some of a plurality of dummy connectors 500 provided in the chip is connected to the ground wirings 807 and 817 via the vias 804 and 814, as in the above embodiment. Each of the dummy connectors 500e that are others of the plurality of dummy connectors 500 is connected to the heat conduction patterns 808 and 818. When dicing is performed, the dummy connectors 500e are removed together with the heat conduction patterns 808 and 818.

Figure 21:
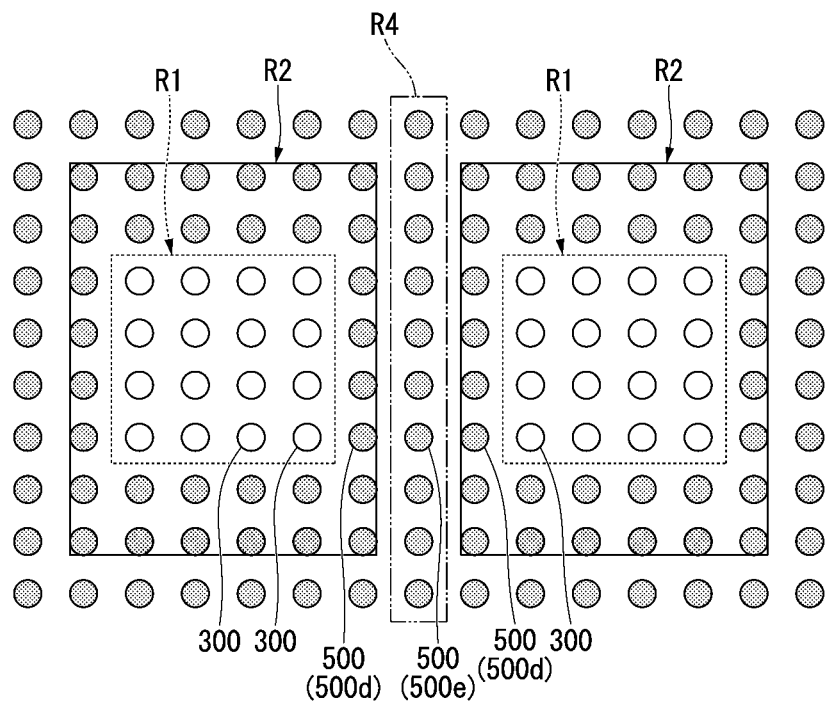
FIG. 21 is a schematic view illustrating a planar structure of a substrate in which a first substrate and a second substrate are bonded according to the fifth embodiment of the present invention.

Specifically, as illustrated in FIG. 21, a region R1 is a region in which the above-described pixels 1 are arranged, and a plurality of connectors 300 are arranged in the region R1. A region R2 is a region that becomes a diced and singulated chip, and is a unit region in which each chip is cut from the substrates 20 and 21. A plurality of connectors 300 and dummy connectors 500d are arranged in the region R2.

Dummy connectors 500e are arranged between the adjacent regions R2. A region R4 in which the dummy connectors 500e are arranged becomes a scribe line to be used when the dicing is performed. That is, when the chip is singulated by dicing, the dummy connectors 500e are removed together with the heat conduction patterns 808 and 818. In this example, the dummy connectors 500e are arranged in one column between the adjacent regions R2.

In the manufacturing method of the present embodiment of manufacturing the chip formed in this manner, the heat conduction pattern 808 is formed in the first substrate 20 and the heat conduction pattern 818 is formed in the second substrate 21 prior to performing the connector arranging process in the fourth embodiment.

Next, in the connector arranging process, the dummy connector 500d is connected to the ground wiring 807 and 817 via the vias 804 and 814, and the dummy connector 500e is connected to the heat conduction patterns 808 and 818 via the vias 804 and 814.

Also, in the removal process, all of the heat conduction patterns 808 and 818 and the dummy connectors 500e included in the region R4 are removed by dicing.

Through this process, the singulated chip is manufactured.

In the chip and the chip manufacturing method of the present embodiment, for example, when the second substrate 21 is mounted on the stage of the manufacturing apparatus and subjected to a process such as dry etching, heat generated in the first substrate 20 can be more effectively dissipated toward the manufacturing apparatus 21 via the second substrate 21 by the dummy connectors 500d and 500e.

Further, since the dummy connectors 500e are removed when the substrate is singulated and used as a chip, it is possible to suppress transfer of the heat between the substrates 20 and 21.

Further, in the present embodiment, while all of the heat conduction patterns 808 and 818 and the dummy connectors 500e have been removed in the removing process, only some of the heat conduction patterns 808 and 818 and the dummy connectors 500e may be removed. This is because it is possible to suppress transfer of the heat between the substrates 20 and 21 even with such a configuration.

Further, in the chip of the present embodiment, the heat conduction patterns 808 and 818 are connected to the dummy connector 500e. However, one of the heat conduction patterns 808 and 818 may not be provided in the substrates 20 and 21 or neither of the heat conduction patterns 808 and 818 may be provided. Even with this configuration, when the process such as dry etching is performed, it is possible to effectively dissipate heat generated in the first substrate 20 toward the manufacturing apparatus via the second substrate 21 by the dummy connectors 500d and 500e.

In the present embodiment, while the dummy connectors 500e have been arranged in one column between the adjacent regions R2, the dummy connectors 500e may be arranged in a plurality of columns between the adjacent regions R2.

Further, in the present embodiment, the dummy connectors 500d may not be included in the chip and all the dummy connectors 500 may be removed by dicing.

While the embodiments of the present invention have been described in detail with reference to the drawings, a specific configuration is not limited to the embodiments described above and includes design modifications without departing from the scope and spirit of the present invention.

For example, in the solid-state imaging device according to the present embodiment, the two substrates may be connected by the connectors 300 and the dummy connectors 500, or three or more substrates may be connected by the connectors 300 and the dummy connectors 500.

(Sixth Embodiment)

Next, a sixth embodiment of the present invention will be described.

The sixth embodiment of the present invention will be described with reference to FIGS. 22 to 27B.

Figure 22:
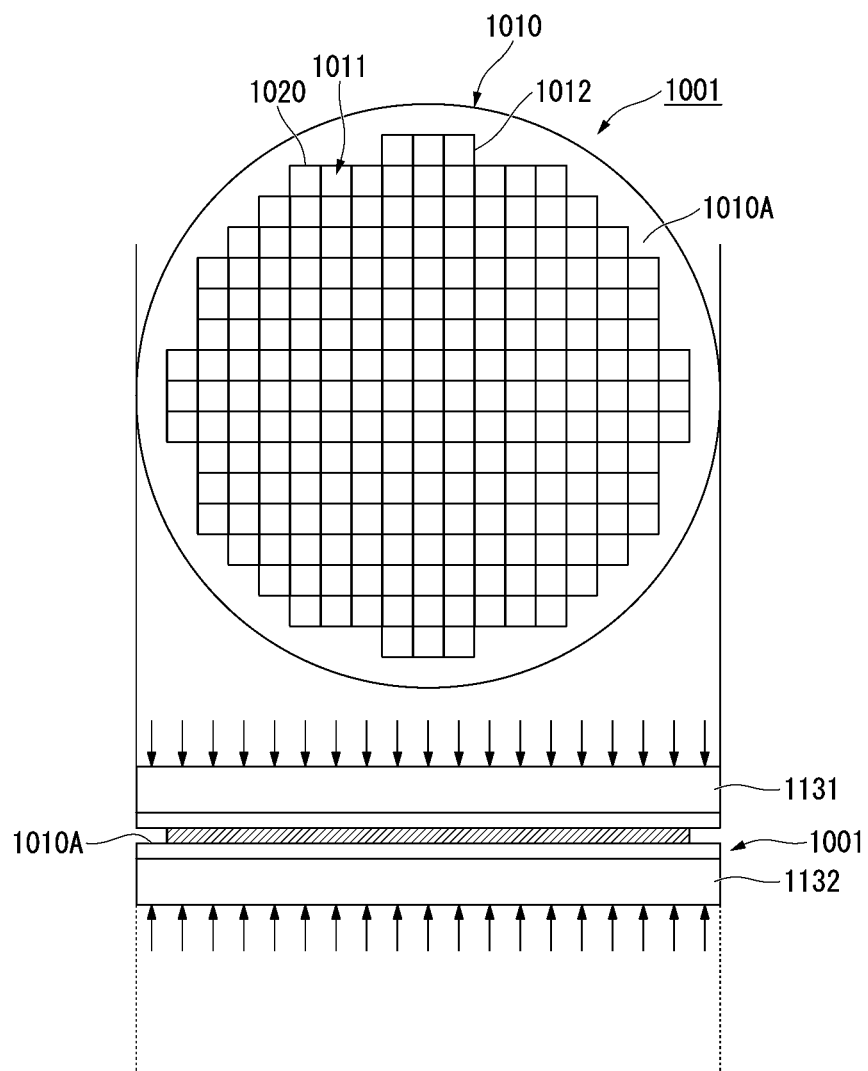
FIG. 22 is a plan view illustrating, on an upper side, a substrate according to an embodiment of the present invention and a diagram illustrating, on a lower side, an operation in which the substrate is bonded.

An upper side of FIG. 22 is a plan view illustrating a substrate 1001 of the present embodiment. The substrate 1001 includes a plate- or sheet-shaped base 1010, and an electrode 1020 formed on a surface of the base 1010.

The base 1010 is formed of an insulator or a semiconductor in a plate or sheet shape having a predetermined thickness. Examples of the insulator and the semiconductor constituting the base 1010 may include silicon, resin, ceramics, and glass. In the present embodiment, a silicon wafer is used as the base 1010.

Further, although not shown, a wiring electrically connected to the electrode 1020 is formed in the base 1010. An aspect of the wiring may be formed on one or both surfaces in a thickness direction of the base 1010 by printing, etching or the like or may be formed to pass through the base, like a via. Further, the aspect of the wiring may be a three-dimensional wiring using stacking technology or may be an appropriate combination thereof.

The one surface of the base 1010 is a bonded surface 1010A that is bonded to another substrate. A plurality of rectangular unit regions 1011 are provided in the bonded surface 1010A. Further, one electrode 1020 having a plurality of electrodes formed with the same layout is formed in each unit region 1011 of the bonded surface 1010A and the same aspect of wiring is formed.

Figure 23:
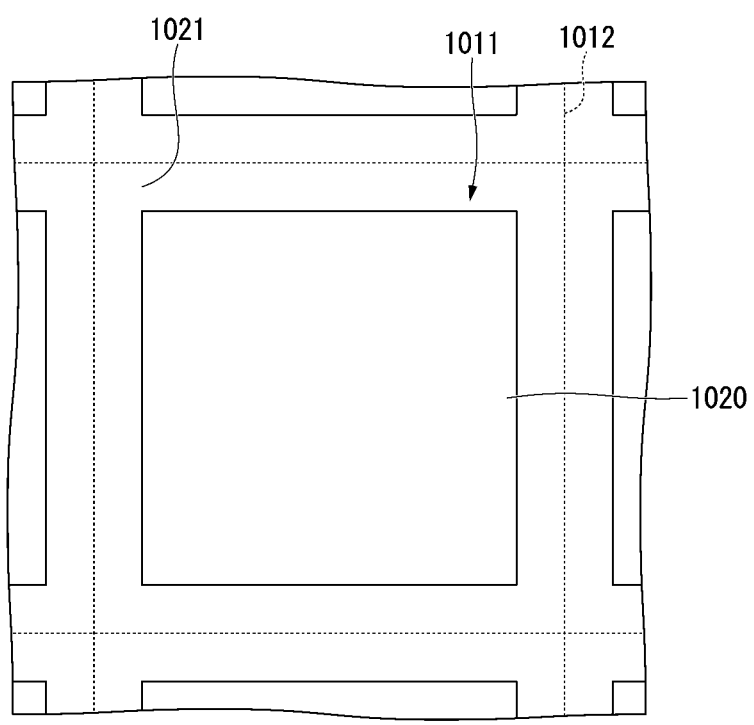
FIG. 23 is an enlarged view illustrating a unit region of the substrate.

FIG. 23 is an enlarged schematic diagram illustrating the unit region 1011. The electrode 1020 is formed in a substantially rectangular shape, when viewed in a plan view of the substrate 1001, by two-dimensionally arranging a plurality of fine projecting electrodes (circuit electrodes) on the base 1010. A region around the electrode 1020, including boundaries 1012 between adjacent unit regions, is a dummy region 1021 in which a plurality of dummy electrodes are arranged.

The boundary 1012 becomes a cutting line at the time of singulation, which will be described below, i.e., a so-called scribe line, but is a conceptual line and need not necessarily be formed in a line shape on the base 1010.

Figure 24:
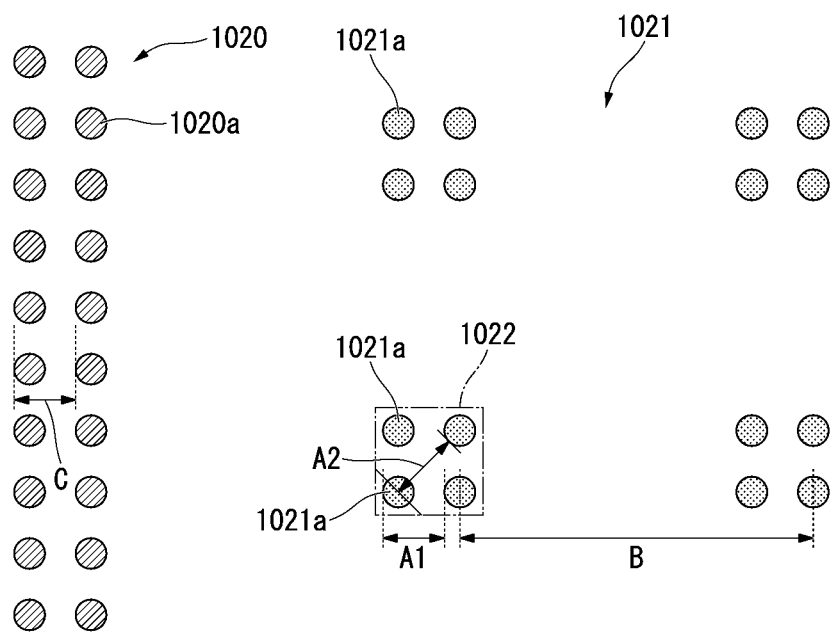
FIG. 24 is an enlarged view illustrating a boundary between an electrode and a dummy region in the unit region.

FIG. 24 is an enlarged diagram illustrating a boundary between the electrode 1020 and the dummy region 1021. A plurality of circuit electrodes 1020a formed in the electrode 1020 and dummy electrodes 1021a formed in the dummy region differ only in whether or not the electrodes are connected to the wirings. Materials and methods of the electrodes may be the same. The height of the dummy electrode 1021a is set to be equal to or less than that of the circuit electrode 1020a. Further, the dummy electrode 1021a may be connected to portions that do not perform signal transfer, such as a supply voltage and a ground.

The circuit electrodes 1020a and the dummy electrodes 1021a are formed of a conductive material, such as a metal. Further, it is desirable for the circuit electrodes 1020a and the dummy electrodes 1021a to be formed of any one of gold, copper, nickel, and an alloy containing at least one of these metals. Further, any of the electrodes can be suitably formed by plating or the like.

As illustrated in FIG. 24, the circuit electrodes 1020a of the electrode 1020 are formed at substantially the same circuit electrode pitch C, although the pitch is slightly changed in some sites depending on whether or not a semiconductor element is provided in the base, an arrangement of the semiconductor element, or the like.

On the other hand, the dummy electrodes 1021a form dummy electrode sets 1022 in which a predetermined number of dummy electrodes are arranged at a predetermined dummy pitch A1 and a maximum distance between the electrodes is A2, and the respective dummy electrode sets 1022 are formed to be arranged at a predetermined set pitch B. In the present embodiment, each dummy electrode set 1022 includes four dummy electrodes 1021a and is arranged so that the four dummy electrodes 1021a form a square.

The inventors of the present invention have examined various patterns for an arrangement aspect when decimating dummy bumps using simulation. There are a case in which another dummy electrode is arranged within a predetermined distance from one dummy electrode and a case in which another dummy electrode is not arranged within the predetermined distance. It has been found that stress applied to the dummy electrode in the latter is several times greater than that in the former.

A mechanism of such a phenomenon is still unclear, but the phenomenon may be considered to be generally for the following reasons.

Figure 25A:
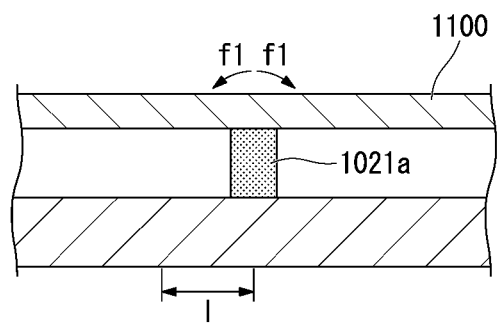
FIG. 25A is a view illustrating a difference of an effect of stress due to an arrangement of a dummy electrode.

When another dummy electrode is not present within a predetermined radius around a dummy electrode 1021a as illustrated in FIG. 25A, the dummy electrode 1021a receives, by itself, a load applied to the other substrate 1100. As a result, a substrate 1100 is bent in all directions around the dummy electrode 1021a, and a great stress f1 is applied in all the directions.

Figure 25B:
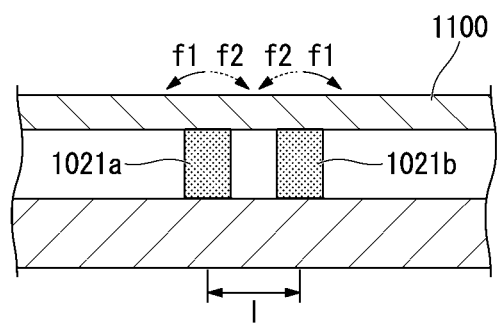
FIG. 25B is a view illustrating a difference of an effect of stress due to an arrangement of dummy electrodes.

On the other hand, there is a case in which another dummy electrode (assigned reference numeral 1021b for convenience of description in FIG. 25B) is present within a radius 1 from the dummy electrode 1021a, as illustrated in FIG. 25B. In this case, since the dummy electrode 1021b supports the substrate 1100 in a direction in which the dummy electrode 1021b is present around the dummy electrode 1021a, flexure of the substrate 1100 is reduced and a stress f2 smaller than the stress f1 is applied. Similarly, as the dummy electrode 1021a is present even for the dummy electrode 1021b, the flexure of the substrate 1100 is partially reduced and a stress in some directions becomes f2.

Figure 25C:
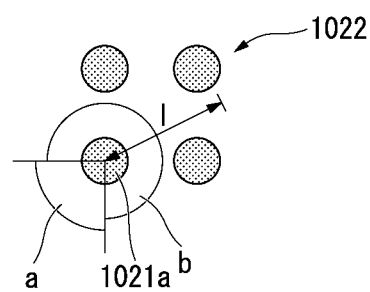
FIG. 25C is a view illustrating a difference of an effect of stress due to an arrangement of dummy electrodes.

As illustrated in FIG. 25C, in the dummy electrode set 1022 of the present embodiment, three other dummy electrodes are all arranged within a range of a radius 1 from one dummy electrode. Accordingly, in the lower left dummy electrode, flexure of the other substrate 1100 in a range b around the lower left dummy electrode is reduced by the three other dummy electrodes and an applied stress is small. For this reason, a relatively greatly bent region of the other substrate region 1100 is limited to a range a, and a total applied stress can be considered to be small. A radius 1 is slightly changed according to a diameter of the dummy electrode, the number of dummy electrodes constituting the dummy electrode set, or the like, but may be considered to be a value that is generally 3 times the diameter of the dummy electrode.

In the present invention, specific values of the dummy pitch A1, the maximum distance between the dummy electrodes A2, the set pitch B, and the circuit electrode pitch C can be appropriately set within a range satisfying the above conditions. However, it is desirable for the dummy pitch A1 to be a value equal to or more than the circuit electrode pitch C and be less than the set pitch B because the number of dummy electrodes can be efficiently reduced.

Further, when the set pitch B is set to be 3 to 10 times the maximum distance between the dummy electrodes A2 or 10 to 100 times the dummy pitch A1, it is possible to more efficiently reduce the number of dummy electrodes while reducing the stress. However, since the dummy electrodes may not play a role in holding the mechanical strength, which is an original purpose of the dummy electrodes, if the set pitch B is set to be too great, it is desirable to exercise caution by checking using an appropriate simulation.

At least two substrates in a combination of the substrates 1001, a combination of the substrate 1001 and a substrate having a semiconductor element formed therein, or a combination between the substrates 1001 having a semiconductor element formed therein are interposed between pressurizing plates 1131 and 1132 in a state in which bonded surfaces 1010A of the substrates are faced, heated and pressurized by a press apparatus that is not shown, and integrally bonded by direct wafer bonding, as shown in a lower side of FIG. 22.

Accordingly, it is possible to form a semiconductor device by electrically bonding the opposing electrodes.

A known wafer bonding apparatus or the like can be used to position the substrate at the time of bonding. Further, prior to bonding, the base surface and the electrode of each substrate may be cleaned by plasma cleaning, reverse sputtering or the like and the electrodes may be bonded using so-called surface activation.

In the substrate 1001 of the present embodiment, because the dummy electrodes 1021a are arranged in the dummy region 1021 in the aspect as described above, it is possible to prevent an excessive stress from being applied to the respective dummy electrodes 1021b and perform bonding while reducing the number of dummy electrodes as compared to an equal interval arrangement.

Figure 26:
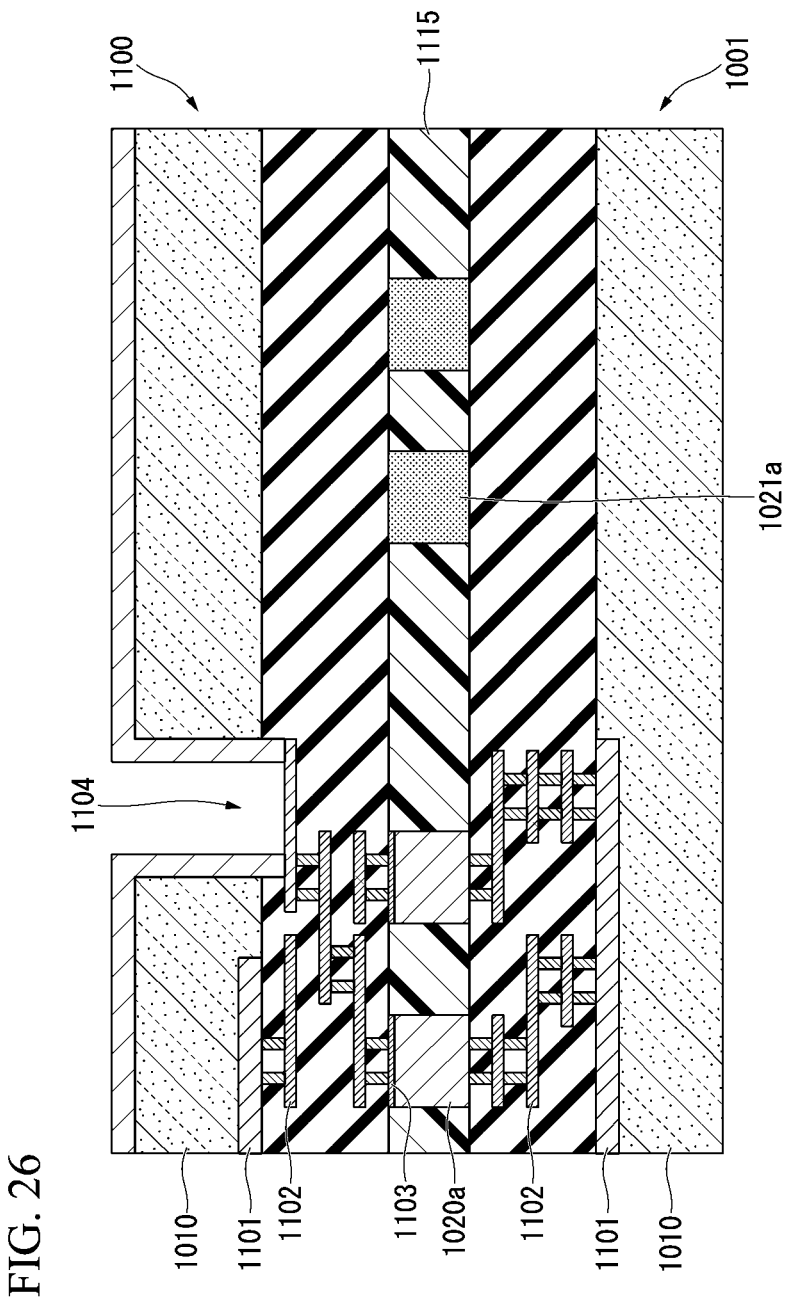
FIG. 26 is a cross-sectional view illustrating an example of a region near a boundary after the substrate is bonded.

After bonding between the substrates ends, a resin is injected into a gap between the substrates to protect the bonded circuit electrodes 1020a. FIG. 26 is a view illustrating an example of a cross section near a boundary in the substrate after a resin 1115 is injected. In this example, both of the substrate 1001 and the other substrate 1100 include a semiconductor element 1101 formed by impurity doping or the like, and a three-dimensionally formed wiring 1102 on the base 1010. An electrode of the substrate 1100 is a flat electrode pad 1103 formed on the wiring 1102. A hole reaching the wiring 1102 is formed in the surface opposite to the bonded surface of the other substrate 1100, and is an external electrode extraction unit 1104 for connecting an external to terminal with the wiring 1102. The external electrode extraction unit 1104 may be filled with a conductive material such as a metal.

Figure 27A:
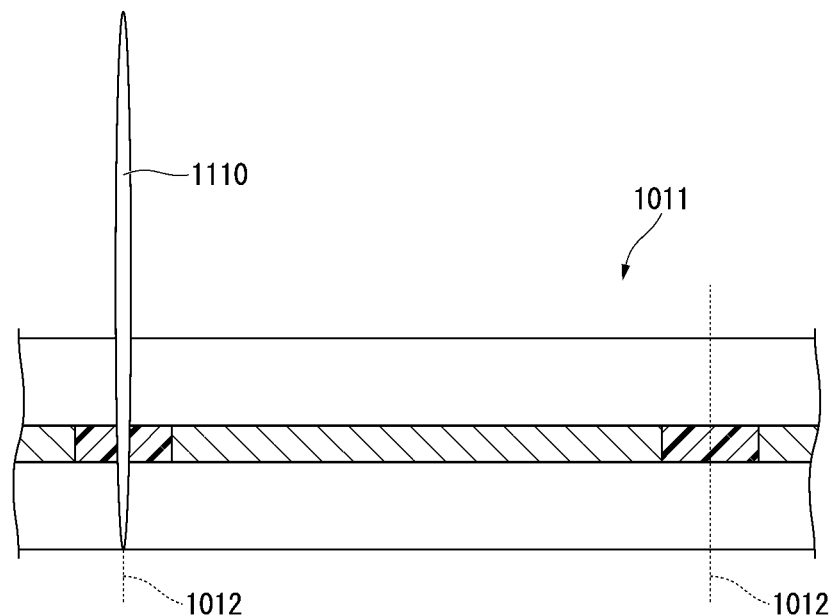
FIG. 27A is a view illustrating a process of singulation.
Figure 27B:
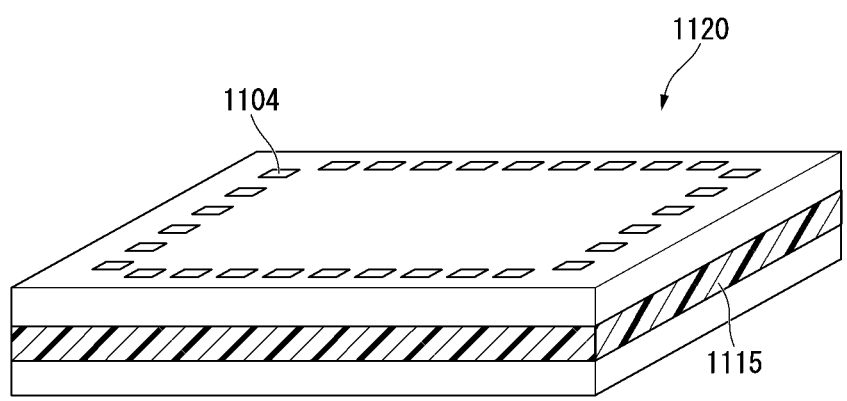
FIG. 27B is a perspective view illustrating one unit region cut as a semiconductor device.

If a bonded substrate is cut into unit regions 1011 along boundaries 1012 using, for example, a blade 1110 as illustrated in FIG. 27A after the substrates are bonded (singulation), a semiconductor device 1120 sealed with the resin 1115 is completed, as illustrated in FIG. 27B.

As described above, according to the substrate 1001 of the present embodiment, the dummy electrodes are arranged in the dummy electrode region 1021 so that the dummy electrode set 1022 includes a predetermined number of dummy electrodes 1021a, as described above. Accordingly, it is possible to suitably prevent damage of the electrodes or the base at the time of bonding by suitably suppressing application of an excessive stress to the individual dummy electrodes while suppressing the number of dummy electrodes to be formed.

Further, since the height of the dummy electrode 1021a is equal to or less than that of the circuit electrode 1020a, it is possible to suppress obstruction of bonding of the circuit electrodes due to the dummy electrodes at the time of bonding, thereby suitably bonding the circuit electrodes.

While the embodiments of the present invention have been described above, the technical scope of the present invention is not limited to the above embodiment, and combinations of the components may be changed, various changes may be made to each component, and each component may be removed without departing from the scope and spirit of the present invention.

Figure 28:
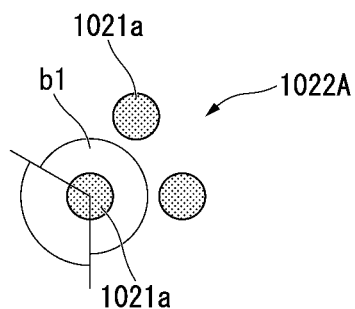
FIG. 28 is a plan view illustrating a dummy electrode set of a variant of the present invention.

First, in the present invention, a shape of the dummy electrode set, the number of dummy electrodes in the dummy electrode set, and the like are not limited to the above examples and may be appropriately set. For example, a triangular dummy electrode set 1022A may be formed of three dummy electrodes 1021a, as in a variant illustrated in FIG. 28. In this case, a stress in a range b1 is reduced in the lower left dummy electrode 1021a in FIG. 28. Even with other shapes, a stress reduction effect is obtained as long as the radius 1 is set to be within 10 times the diameter of the dummy electrode as a result of the examination conducted by the inventors.

Further, the dummy electrode set need not be formed in the entire dummy region and may be formed only in a partial dummy region. In other regions, the dummy electrodes may be arranged at equal intervals. Even with this, a certain effect can be obtained.

Figure 29:
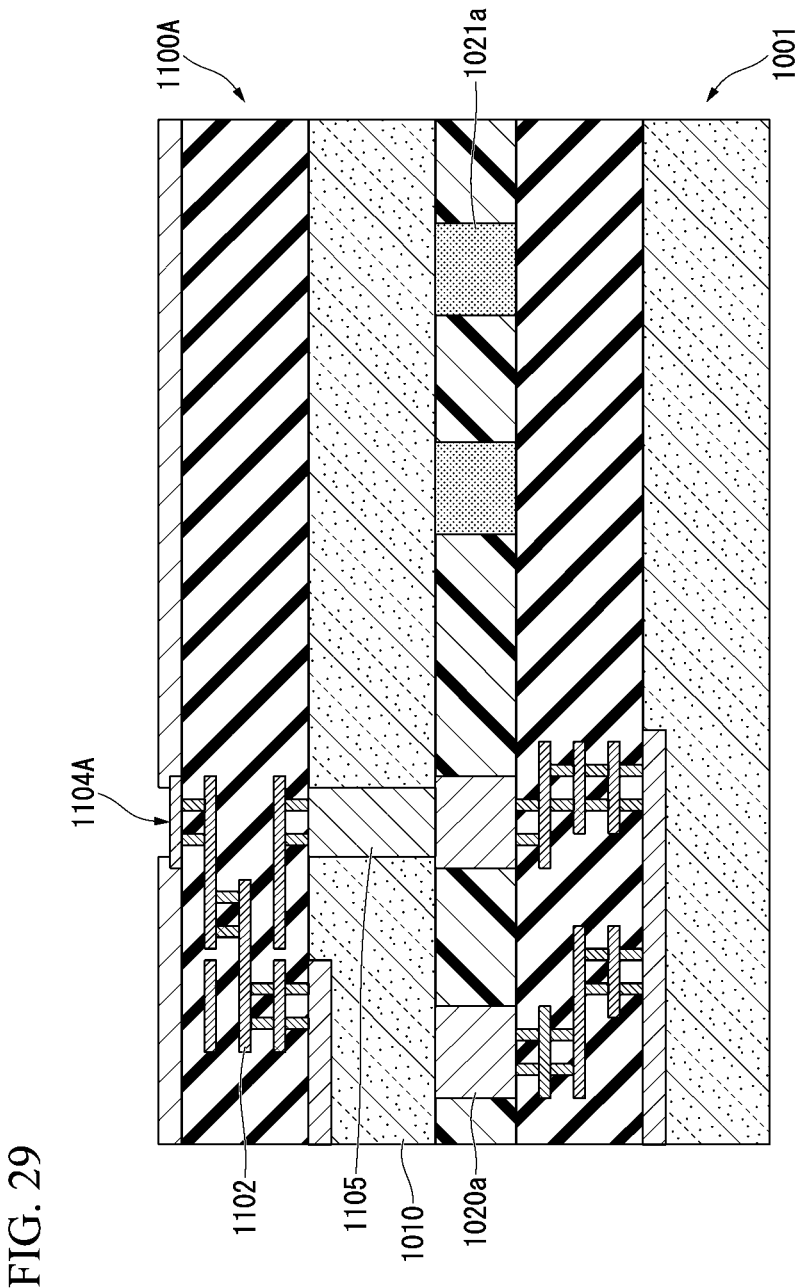
FIG. 29 is a cross-sectional view illustrating another example of a region near a boundary after the substrate of the present invention is bonded.

Further, as in a variant illustrated in FIG. 29, the substrate 1001 of the present invention may be bonded to a surface opposite to a surface of the other substrate 1100A in which a wiring 1102 is formed. In this case, a hole reaching the wiring 1102 may be provided in a base 1010 of the other substrate 1100A, the hole may be filled with a conductive material to form a through electrode 1105, and a circuit electrode 1020a and the through electrode 1105 may be bonded. Meanwhile, a portion of the wiring 1102 exposed to an upper surface is directly used as an external electrode extraction unit 1104A.

Further, three or more substrates, at least one of which is the substrate of the present invention, may be bonded to form a semiconductor device.

Types of the substrate of the present invention and a semiconductor device formed by bonding the substrate are not particularly limited, but a large number of electrodes need be formed at a narrow pitch, like a case in which a circuit electrode diameter or a circuit electrode pitch is 20 micrometers in a solid-state imaging device having a number of pixels. Accordingly, there are many merits that can be obtained by applying the present invention, and it is very suitable to apply the structure of the present invention.

Further, a computer program product for realizing any combination of the respective components or the respective processes described above is valid as an aspect of the present invention. The computer program product refers to a recording medium, an apparatus, a device, or a system having program code incorporated therein, such as a recording medium having program code recorded thereon (a DVD medium, a hard disk medium, a memory medium, or the like), a computer having program code recorded thereon, and an Internet system having program code recorded thereon (e.g., a system including a server and a client terminal). In this case, each component or each process described above is mounted on each module, and program code including the mounted module is recorded in the computer program product.

A program for realizing any combination of the components or the processes according to the above-described embodiment is also valid as an aspect of the present invention. The object of the present invention can be achieved by recording the program in a computer-readable recording medium and reading and executing the program recorded in the recording medium using a computer.

Here, the "computer" also includes a homepage providing environment (or a display environment) if a WWW system is used. Also, the "computer-readable recording medium" includes a portable medium such as a flexible disk, a magnetic optical disc, a ROM, or CD-ROM, and a storage device such as a hard disk embedded in a computer. Also, the "computer-readable recording medium" includes a medium that holds a program for a predetermined time, such as a volatile memory (RAM) inside a computer system consisting of a server and a client when a program is transmitted via a network such as the Internet or a communication line such as telephone line.

Further, the above-described program may be transmitted from a computer in which the program is stored in a storage device or the like to other computers via a transmission medium or by transmission waves in the transmission medium. Here, the "transmission medium" for transmitting the program refers to a medium having a function of transmitting information, such as a network (communication network) such as the Internet or a communication line such as a telephone line. Also, the above-described program may be a program for realizing some of the above-described functions. Alternatively, the program may be a program capable of realizing the above-described functions through a combination with a program previously stored in a computer system, i.e., a differential file (a differential program).

While the preferred embodiments of the present invention have been described above, various alternatives, variations, and equivalents may be used as each component or each process described above. In the embodiments disclosed in the present disclosure, one part may be substituted with a plurality of parts or a plurality of parts may be substituted with one part to execute one or a plurality of functions. Such substitutions fall in a range of the present invention except for a case in which the substitutions do not appropriately act in order to achieve the object of the present invention. Accordingly, the range of the present invention is not determined with reference to the above description, but may be determined by claims, including an entire scope of equivalents. In the claims, the number of each component is one or more, unless explicitly stated otherwise. It should not be construed that the claims include a means-plus-function limitation unless explicitly described using phrases such as "means for . . . " in the claims.

The terminology used in the present disclosure is for the purpose of describing particular embodiments only and is not intended to limit the present invention. In this disclosure, the singular forms "a," "an" and "the" are intended to include the plurality of forms as well, unless the context clearly indicates otherwise.

While the preferred embodiments of the present invention have been described, the present invention is not limited to these embodiments. Additions, omissions, substitutions, and other modifications of components are possible without departing from the scope and spirit of the present invention. The present invention is limited by the above-described description and is limited only by the scope of the appended claims.

What is claimed is:

1. A solid-state imaging device comprising:
   a first substrate formed on a first semiconductor wafer;
   a second substrate formed on a second semiconductor wafer; and
   a connector electrically connects the substrates,
   wherein the first substrate and the second substrate are bonded via the connector;
   the first substrate includes a photoelectric conversion unit;
   the second substrate includes an output circuit that acquires a signal generated by the photoelectric conversion unit via the connector and outputs the signal; and
   dummy connectors that support the first and second substrates that are bonded with each other are further arranged in a substrate region in which the connector is not arranged, in a substrate region of at least one of the first substrate and the second substrate.

2. The solid-state imaging device according to claim 1, wherein:
   an arrangement interval of the dummy connectors is the same as an arrangement interval of the connector.

3. The solid-state imaging device according to claim 2, wherein:
   an arrangement of at least one of the dummy connectors is omitted.

4. The solid-state imaging device according to claim 3, wherein:
   the arrangement of the dummy connectors is omitted to reduce pressure to be applied to the first semiconductor wafer and the second semiconductor wafer at the time of the bonding.

5. The solid-state imaging device according to claim 2, wherein:
   an arrangement position of at least one of the dummy connectors is shifted from arrangement positions at equal intervals.

6. The solid-state imaging device according to claim 5, wherein:
   when dicing is performed after the first semiconductor wafer and the second semiconductor wafer are bonded, arrangement position of the dummy connectors is shifted from arrangement position at equal interval so that the first semiconductor wafer and the second semiconductor wafer are not separated.

7. The solid-state imaging device according to claim 2, comprising:
   the first substrate includes a plurality of photoelectric conversion elements
   wherein the photoelectric conversion elements are classified into one of one or more groups, and
   a plurality of photoelectric conversion elements classified into the same group share one connector.

8. The solid-state imaging device according to claim 1, wherein:
   the arrangement interval of the dummy connector is the same as an arrangement interval of the photoelectric conversion units.

9. The solid-state imaging device according to claim 8, wherein:
   an arrangement of at least one of the dummy connectors is omitted.

10. The solid-state imaging device according to claim 8, wherein:
    an arrangement position of at least one of the dummy connectors is shifted from arrangement positions at equal intervals.

11. The solid-state imaging device according to claim 1, wherein:
    the dummy connectors are arranged to prevent distortion, cracks, and chipping of the first substrate and the second substrate.

12. The solid-state imaging device according to claim 1, wherein:
    an arrangement interval of at least some of the dummy connectors is greater than the arrangement interval of the photoelectric conversion units.

13. The solid-state imaging device according to claim 1, wherein:
    the arrangement interval of at least some of the dummy connectors is greater than the arrangement interval of the connectors.

14. The solid-state imaging device according to claim 1, wherein:
    a plurality of unit circuits are arranged in a peripheral circuit region different from a region in which the photoelectric conversion units are arranged, and
    an arrangement position of the dummy connector arranged on a circuit element constituting the unit circuit is common to the plurality of unit circuits.

15. The solid-state imaging device according to claim 1, wherein:

a plurality of unit circuits are arranged in a peripheral circuit region different from a region in which the photoelectric conversion units are arranged, and the dummy connector is arranged to suppress variations in circuit characteristics of the plurality of unit circuits.

16. The solid-state imaging device according to claim 1, wherein:

the first substrate includes a peripheral circuit, and
the dummy connectors are arranged in a region outside the peripheral circuit included in the first substrate.

17. The solid-state imaging device according to claim 1, wherein:

the second substrate includes a peripheral circuit, and
the dummy connectors are arranged in a region outside the peripheral circuit included in the second substrate.

18. The solid-state imaging device according to claim 1, wherein:

the first substrate and the second substrate include a peripheral circuit, and
the dummy connectors are arranged in regions outside the peripheral circuit included in the first substrate and outside the peripheral circuit included in the second substrate.

19. The solid-state imaging device according to claim 1, wherein:

the second substrate includes an accumulation circuit that accumulates a signal acquired via the connector, and
the output circuit outputs the signal accumulated in the accumulation circuit.

20. A solid-state imaging device comprising:
a first substrate formed on a first semiconductor wafer;
a second substrate formed on a second semiconductor wafer; and
a connector electrically connects the substrates,
wherein the first substrate and the second substrate are bonded via the connector;
the first substrate includes a photoelectric conversion unit;
the second substrate includes an output circuit that acquires a signal generated by the photoelectric conversion unit via the connector and outputs the signal; and
dummy connectors that do not electrically connect the first substrate with the second substrate are further arranged in a region in which the connectors are not arranged, in a substrate region of at least one of the first substrate and the second substrate.

21. An imaging apparatus comprising:
a first substrate formed on a first semiconductor wafer;
a second substrate formed on a second semiconductor wafer; and
a connector electrically connects the substrates,
wherein the first substrate and the second substrate are bonded via the connector;
the first substrate includes a photoelectric conversion unit;
the second substrate includes an output circuit that acquires a signal generated by the photoelectric conversion unit via the connector, and outputs the signal; and
dummy connectors that support the first and second substrates that are bonded with each other are further arranged in a substrate region in which the connectors are not arranged, in a substrate region of at least one of the first substrate and the second substrate.

22. A method of manufacturing a solid-state imaging device in which a first substrate formed on a first semiconductor wafer and a second substrate formed on a second semiconductor wafer are bonded via connectors that electrically connect the substrates, the method comprising:

further arranging dummy connectors that support the first and second bonded substrates, in a substrate region in which the connectors are not arranged in a substrate region of at least one of the first substrate including photoelectric conversion units and the second substrate including an output circuit that acquires a signal generated by the photoelectric conversion unit via the connector and outputs the signal.

23. The method of manufacturing a solid-state imaging device according to claim 22, comprising:

a removal process of performing dicing to remove at least some of the dummy connectors after the connector arranging process.

24. The method of manufacturing a solid-state imaging device according to claim 22, wherein:

a ground wiring is provided in the first substrate, and
the dummy connector is connected to the ground wiring in the connector arranging process.

25. The solid-state imaging device according to claim 1, wherein:

the solid-state imaging device is diced to remove at least some of the dummy connectors.

26. The solid-state imaging device according to claim 25, wherein:

heat conduction patterns insulated from the photoelectric conversion unit and connected to the dummy connectors are provided in the first substrate, and
the solid-state imaging device is diced to remove at least some of the heat conduction patterns.

27. The solid-state imaging device according to claim 25, wherein:

heat conduction patterns insulated from the output circuit and connected to the dummy connector are provided in the second substrate, and
the solid-state imaging device is diced to remove at least some of the heat conduction patterns.

28. The solid-state imaging device according to claim 25, wherein:

a first wiring insulated from the photoelectric conversion unit and connected to the dummy connector is provided in the first substrate,
a second wiring insulated from the output circuit and connected to the dummy connector is provided in the second substrate, and
the solid-state imaging device is diced to remove at least some of the heat conduction patterns.

29. The solid-state imaging device according to claim 1, wherein:

a ground wiring is provided in the first substrate, and
the ground wiring is connected to the dummy connector.

30. The solid-state imaging device according to claim 1, wherein:

a ground wiring is provided in the second substrate, and
the ground wiring is connected to the dummy connector.

31. The solid-state imaging device according to claim 1, wherein:

a first ground wiring is provided in the first substrate,
a second ground wiring is provided in the second substrate, and
the first ground wiring and the second ground wiring are connected to the dummy connector.

* * * * *